(12) United States Patent
Kumar et al.

(10) Patent No.: US 6,471,833 B2
(45) Date of Patent: *Oct. 29, 2002

(54) HIGH ETCH RATE METHOD FOR PLASMA ETCHING SILICON NITRIDE

(75) Inventors: Ajay Kumar; Anisul Khan, both of Sunnyvale; Jeffrey D Chin, Foster City; Dragan V Podlesnik, Palo Alto, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/853,847

(22) Filed: May 11, 2001

(65) Prior Publication Data

US 2001/0019897 A1 Sep. 6, 2001

Related U.S. Application Data

(63) Continuation of application No. 09/430,798, filed on Oct. 29, 1999, now Pat. No. 6,270,634.

(51) Int. Cl.[7] .......................... C23C 14/34; B44C 1/22; C03C 15/00; C03C 25/68
(52) U.S. Cl. ...................... 204/192.37; 216/67; 216/68
(58) Field of Search .................. 204/192.32, 192.37; 216/67, 68

(56) References Cited

U.S. PATENT DOCUMENTS

| 4,726,879 A | 2/1988 | Bondur et al. ............. 156/643 |
| 4,793,897 A | 12/1988 | Dunfield et al. .......... 156/643 |
| 5,178,739 A | 1/1993 | Barnes et al. ........... 204/192.12 |
| 5,259,922 A | 11/1993 | Yamano et al. ............ 156/643 |
| 5,427,975 A | 6/1995 | Sparks et al. ............ 437/79 |
| 5,476,494 A | 12/1995 | Edell et al. ............. 607/116 |
| 5,525,535 A | 6/1996 | Hong ..................... 437/70 |
| 5,531,121 A | 7/1996 | Sparks et al. ............ 73/716 |

(List continued on next page.)

FOREIGN PATENT DOCUMENTS

| EP | 0521634 B1 | 1/1993 | .............. B41J/2/16 |
| EP | 0771658 A2 | 5/1997 | .............. B41J/2/16 |

OTHER PUBLICATIONS

J. Vossen et al.*, "Thin Film Processes", Academic Press : New York, pp. 531–533 (1978).

Primary Examiner—Steven H. Ver Steeg
(74) Attorney, Agent, or Firm—Benjamin Glenn; Shirley L. Church; Kathi Bean

(57) ABSTRACT

This invention is directed to a method for rapid plasma etching of materials which are difficult to etch at a high rate. The method is particularly useful in plasma etching silicon nitride layers more than five microns thick. The method includes the use of a plasma source gas that includes an etchant gas and a sputtering gas. Two separate power sources are used in the etching process and the power to each power source as well as the ratio between the flow rates of the etchant gas and sputtering gas can be advantageously adjusted to obtain etch rates of silicon nitride greater than two microns per minute. Additionally, an embodiment of the method of the invention provides a two etch step process which combines a high etch rate process with a low etch rate process to achieve high throughput while minimizing the likelihood of damage to underlying layers. The first etch step of the two-step method provides a high etch rate of about two microns per minute to remove substantially all of a layer to be etched. In the second step, a low etch rate process having an etch rate below about two microns per minute is used to remove any residual material not removed by the first etch step.

29 Claims, 8 Drawing Sheets

U.S. PATENT DOCUMENTS

| | | | |
|---|---|---|---|
| 5,531,787 A | 7/1996 | Lesinski et al. | 623/10 |
| 5,575,813 A | 11/1996 | Edell et al. | 607/116 |
| 5,786,276 A | 7/1998 | Brooks et al. | 438/724 |
| 5,854,136 A | 12/1998 | Huang et al. | 438/714 |
| 5,872,061 A | 2/1999 | Lee et al. | 438/705 |
| 5,932,315 A | 8/1999 | Lum et al. | 428/172 |
| 6,009,830 A | 1/2000 | Li et al. | 118/723 R |
| 6,270,634 B1 * | 8/2001 | Kumar et al. | 204/192.37 |

* cited by examiner

HIGH ETCH RATE METHOD FOR PLASMA ETCHING SILICON NITRIDE

This application is a continuation application of application Ser. No. 09/430,798, filed Oct. 29, 1999, which issued as U.S. Pat. No. 6,270,634 to Khan et al., on Aug. 7, 2001.

BACKGROUND OF THE INVENTION

1. Field of the Invention

This invention relates to plasma enhanced etch processes. More particularly, this invention relates to plasma etch processes useful in etching thick layers of silicon nitride for printhead cartridges, inkjet printers, surgical instruments, bio—medical devices and other articles where silicon nitride structures are shaped or formed.

2. Description of the Related Art

Silicon nitride is a desirable compound for structures such as printhead cartridges and surgical devices because it retains its shape and is resilient. However, the very characteristics that make silicon nitride a material of choice are the characteristics that make most silicon nitride fabrication processes difficult and time consuming.

Silicon nitride has been used in integrated circuit devices as an etch stop or masking layer, a protective layer, and a dielectric layer. The high durability of silicon nitride also makes it useful in fabrication or micro-machining of small devices such as surgical instruments, biomedical implements and printer cartridges. Compared to integrated circuit devices, the amount of silicon nitride material required in above listed micro-machining applications is often orders of magnitude greater than the material required for integrated circuits. For example, the thickness of a passivation layer of silicon nitride in an integrated circuit device may be on the order of hundreds of angstroms ($1\text{Å}=1\times10^{-10}$ m). In contrast, a typical micro-machining application the thickness of a silicon nitride layer may be on the order of tens of microns or even more than one hundred microns. As a result, etching methods suitable for use in integrated circuits and relatively thinner silicon nitride layers may prove impractical for use with substantially thicker silicon nitride layers.

One conventional method of etching silicon nitride is wet etching. In wet etch processes, the workpiece having the material to be etched is loaded into a chemical bath. The composition of the chemical bath is selected to remove the exposed materials. Phosphoric acid and hydrogen fluoride are commonly employed to etch silicon nitride. Wet etch methods are necessarily isotropic which may be undesirable when forming precise shapes or shapes with small features. Additionally, chemical baths are dangerous because of potential exposure to reactants. Wet etch rates can also vary as the etched materials alter the chemical make-up of the bath. The variable chemical make-up results in etch rate variations from batch to batch.

Conventional dry etch methods, also known as reactive ion etching, offer several improvements over wet etch methods. Reactive ion etch processes are more repeatable than the chemically variable bath. This repeatability of the etch process thereby increases the likelihood that each workpiece in a batch is exposed to the same etch process. In this manner, repeatability and manufacturability of the etch process is improved.

Regardless of whether conventional dry or wet etch methods are employed, removal rates for silicon nitride are not commercially viable for micro-machining applications. Here, micro-machining applications refer to those applications requiring the removal of about five microns of material, to applications which remove between about 10 to 50 microns of material. Some applications entail the removal of over 100 microns of material. The problem of etching such large amounts of material is brought into specific relief when one considers that etch rates in both chemical wet etch baths and reactive ion etch processes produce etch rates on the order of hundreds of angstroms per minute.

For example, U.S. Pat. No. 4,793,397 entitled "Selective Thin Film Etch Process" issued to Dunfield et al. on Dec. 27, 1988) describes silicon nitride etch processes which utilize plasmas formed from mixtures of $SiF_4$, and $O_2$; $NF_3$, $SiF_4$, and $O_2$; and $NF_3$, $SiF_4$, He and $O_2$. According to Dunfield, these plasmas provide silicon nitride etch rates in "a useful range of 0–500 Å per minute" and a "preferred range of 100–200 Å/minute." Almost ten years later on Jul. 28, 1998, U.S. Pat. No. 5,786,276 entitled "Selective Plasma Etching of Silicon Nitride In Presence of Silicon or Silicon Oxides Using Mixture of $CH_3F$ or $CH_2F_2$ and $CF_4$ and $O_2$" issued to Brooks et al. According to Brooks, "high SiN etch rates are defined as at least about 1000 Å/min. and . . . even more preferably at least about 2500 Å/min."

The etch rates described by Brooks and Dunfield may be suitable for integrated circuit device applications where silicon nitride thicknesses are generally less than 2 microns and are more likely to be only a few hundred angstroms. In contrast, micro-machining applications generally have silicon nitride layers greater than five microns thick while some applications have silicon nitride layers ranging in thickness from about 15 microns to about 50 microns. Still other micro-machining applications require machining silicon nitride layers over 100 microns thick. The etch rates provided by the previously described etch methods would result in unreasonably long processing times. Such long processing times would hinder manufacturing processes of articles with thick (i.e. greater than 5 microns) silicon nitride structures to such an extent that commercial fabrication of silicon nitride structures and articles becomes impracticable.

Thus, what is needed is a method of plasma etching thick silicon nitride layers for micro-machining applications that overcomes the shortcomings of the prior art to provide higher, commercially viable silicon nitride etch rates.

BRIEF SUMMARY OF THE INVENTION

The present invention provides a method of plasma etching a silicon nitride layer by forming a plasma from a gaseous mixture consisting essentially of an etchant gas in a sputtering gas; and etching a silicon nitride layer at more than two microns per minute.

In another embodiment, the present invention provides a method for plasma etching a material by forming a first plasma from a first gaseous mixture consisting essentially of an etchant gas and a sputtering gas; etching a first portion of said material with said first plasma at an etch rate of about two microns per minute; forming a second plasma from a second gaseous mixture different from said first gaseous mixture, said second gaseous mixture consisting essentially of an etchant gas and a sputtering gas; and etching a second portion of said material with said second plasma at an etch rate less than said first plasma etch rate.

These and other features, aspects, and advantages of the present invention will be better understood from the following drawings, description and appended claims, which illustrate examples of the invention.

BRIEF DESCRIPTION OF THE SEVERAL VIEWS OF THE DRAWINGS

While the description and drawings below illustrate exemplary features of the invention, it is to be understood

DETAILED DESCRIPTION OF THE INVENTION

INTRODUCTION

Methods of the present invention will be described as used to etch a silicon nitride layer that is one of a plurality of layers formed on a workpiece. The single processing step method of the present invention provides a single etch step process that achieves a silicon nitride etch rate of at least about two microns per minute. In an alternative two step embodiment of the present invention, an etch step with a silicon nitride etch rate of greater than about two microns per minute is conducted and then followed by another etch step with a silicon nitride etch rate of less than about two microns per minute. The high silicon nitride etch rates obtained by the single step embodiment and the first processing step of the two etch step embodiment enable commercially viable silicon nitride micro-fabrication processes. While embodiments of the method of the present invention can be implemented in a variety of processing chambers, the inventive method will be described as implemented on a computer-controlled high density plasma etching chamber 200, as illustrated and described below in greater detail with regard to FIGS. 5A and 5B.

I. Single Plamsa Etch Step Method

Figure 1:
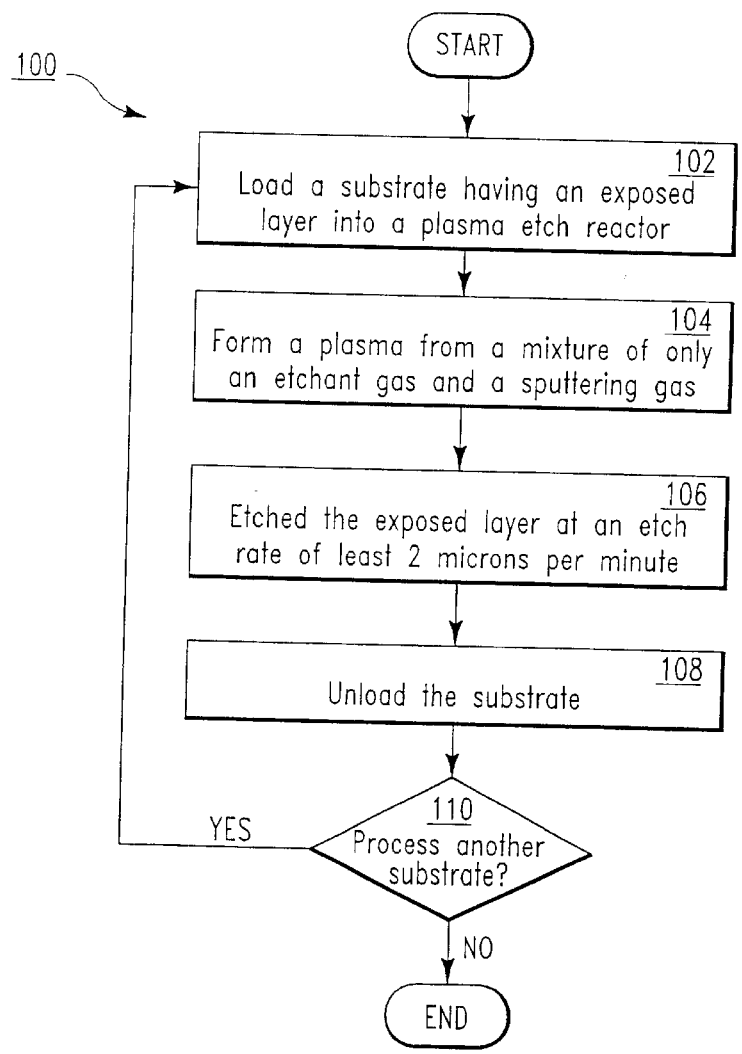
FIG. 1 is a flow chart of the single etch step method of the present invention.

Flow diagram 100 of FIG. 1 sets forth a single step embodiment of the method of the present invention. According to diagram 100, the first step as set forth in block 102 is to load a substrate having an exposed layer into a processing reactor. The processing reactor for this description is the high-density plasma reactor 200 which is illustrated in FIG. 5 and described in greater detail below. In high-density plasma reactor 200, a workpiece 203 would be loaded onto substrate support 216.

Figures 2A, 2B:
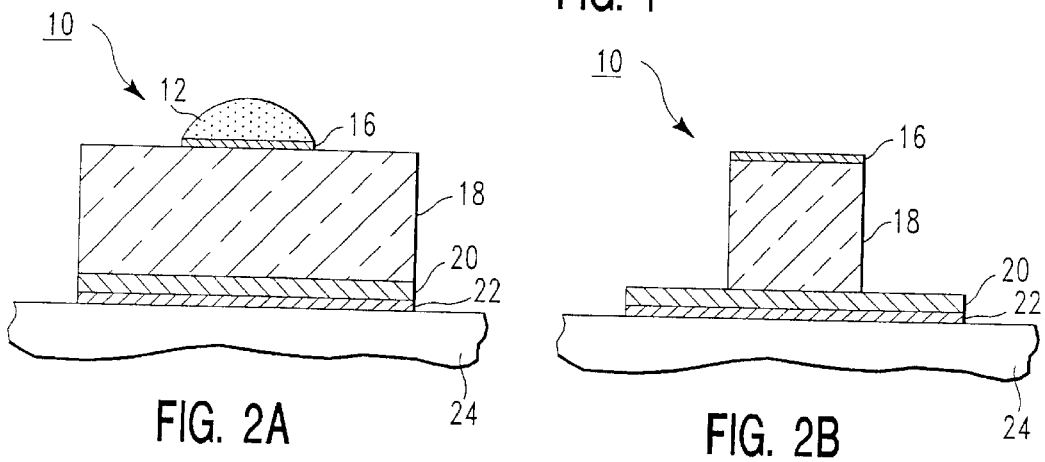
FIG. 2A is a schematic cross-section of a structure having a plurality of layers formed thereon and an exposed layer to be etched.
FIG. 2B is a schematic cross-section of the structure of FIG. 2A after performing the single etch step method of the present invention.

In one application, workpiece 203 could have an exposed layer that is part of a plurality of layers. One such arrangement is a structure 10 illustrated in FIGS. 2A and 2B and representative of a layer stack useful in the fabrication of print head cartridges. Structure 10 is not drawn to scale. In a representative print head cartridge application, structure 10 would be about 15 to 50 $\mu$m in length and adjacent structures would be spaced about 50 to 100 $\mu$m apart. Generally, more than 100 such structures may be formed from a single 150 mm diameter workpiece. FIGS. 2A and 2B illustrate, respectively, a structure 10 before (FIG. 2A) and after (FIG. 2B) processing according to the single plasma etch step of the present invention.

The structure 10 is formed on a workpiece such as a silicon substrate 24 onto which a seed layer 22 is formed. The seed layer 22 helps alleviate the stress problems associated with forming thick silicon nitride layers. One suitable material for seed layer 22 is titanium nitride. Seed layer thickness varies with the thickness of the silicon nitride layer being formed. For example, a seed layer 22 about 0.9 microns thick and formed from titanium nitride could be suitable for a silicon nitride layer of about 10–20 microns.

Formed on top of seed layer 22 is conductive material layer 20. This layer could be formed from a conductive material such as aluminum and have a thickness of about four microns. Next, on top of conductive layer 20 is a thick layer of insulating material 18. In structure 10, insulating layer 18 is the layer to be etched or "machined" by the method of the present invention. While useful in etching a wide variety of materials, the plasma etch method of the present invention is particularly useful in obtaining high etch rates (i.e., etch rates greater than 2 $\mu$m per minute) on difficult to etch materials such as silicon nitride. It is to be appreciated that a "thick" layer is used to distinguish between the "thin" layer typical of semiconductor devices. Instead of a layer several hundred angstroms thick as is typical in semiconductor device fabrication, the present invention is better suited to fabrication processes involving etching of layers at least about five microns thick to a layer thickness between about 15 to 25 microns thick and up to and including layers over 100 microns thick.

Formed on top of the insulating layer 18 is another conductive layer 16. Formed on top of conductive layer 16 is a masking layer 12. Thus, structure 10 represents a pattern transfer arrangement wherein the portions of insulating layer 18 not covered or masked by masking layer 12 are removed by the plasma etch processes of the present invention. Alternatively, structure 10 could be formed without a masking layer 12 but instead use conductive layer 16 to function as a masking layer.

Returning to flow diagram 100 of FIG. 1, the next step of the present invention, as set forth in block 104, is form a plasma from a mixture of an etchant gas and a sputtering gas. Advantageously, this mixture represents an etch process with an aggressive chemical etch component and an effective ion bombardment component. Plasmas formed according to the inventive method achieve high etch rates (i.e. etch rates greater than two microns per minute) for difficult to etch materials such as silicon nitride.

According to the present invention, the etchant gas makes up most of the gas mixture. In one embodiment, the etchant gas is more than 80% of the gas mixture with the sputtering gas comprising the remainder of the mixture. In another embodiment, the etchant gas comprises about 86% of the gas mixture. The etchant gas could be any multiple fluorine atom compound suitable for plasma etching. Applicant's have found that $SF_6$ is particularly useful as an etchant since several highly reactive fluorine atoms are provided by $SF_6$ dissociation which result in an aggressive chemical etch portion of the process. The sputtering gas could be, for example, an inert gas. Applicant's have found that Argon is particularly useful as a sputtering gas.

Referring again to FIG. 5A, the separately controllable source generator 218 and bias generator 222 of high density plasma chamber 200 are particularly well suited for practicing the present invention. Source generator 218, also referred to as source power, is applied to an inductive coil antenna 212 through impedance matching network 219. Bias generator 222, also referred to as bias power, is applied to pedestal 216 through impedance matching network and the density of ions in plasma 236. Energy from bias generator 222 mostly controls the energy of the ion flux or bombardment energy incident on the workpiece 203 on support pedestal 216. Computer system 510, described in more detail below with regard to FIG. 5B, is coupled to the various components of plasma etch system 200 and controls the gas flow, source and bias power levels and processing environment within processing chamber 210.

Generally, the etch rate of the method of the present invention increases with the level of source power. The bias power is mostly used to control the sputtering component of the etch process. The sputtering component generally controls the profile of the etched structure by removing by product formed during the etching process. It is to be appreciated that the total power applied to plasma 236 is the sum of the source power level (i.e., the power level of source generator 218) and the bias power level (i.e., the power level of bias generator 222). According to an embodiment of the present invention, about 90% or more of the total power provided to the plasma is provided by source generator 218. The source power level could be from about 1800 watts to about 2500 watts. According to another embodiment of the present invention, bias power level makes up about 10% of the total power. In a preferred embodiment, the bias power level is about 200 watts.

The plasma formed according to the present invention, as set forth in block 104, is formed at a pressure below about 50 mTorr (mT). In specific embodiments of the invention, the pressure within the process reactor could be between about 20 mT to about 40 mT.

Referring to FIG. 1, the next step of the present invention, as set forth in block 106, is etch the exposed layer at a rate of at least about two microns per minute. We have found that plasmas formed from an etchant gas, a sputtering gas and power level combinations according to the present invention advantageously achieve etch rates of at least about two microns per minute on silicon nitride layers . Referring by way of example to FIG. 2B, structure 10 appears as shown in FIG. 2B after exposure to the plasma formed according to the present invention. The structure 10 illustrated in FIG. 2B represents the transfer of the mask pattern of masking layer 12 onto the insulating layer 18.

The duration of the inventive etch process could be determined by any number of methods. For example, if the thickness of the exposed layer (i.e., insulating layer 18 in structure 10) and the etch rate of the material used to form the exposed layer are known, the etch time is a simple calculation. Alternatively, an endpoint detection system (e.g., an optical emission spectroscopy (OES) system) could be used to detect either the change in the spectrum emission of plasma 236 as the plasma etches through one layer into another. Endpoint detection methods and apparatus are well known in the art and one of ordinary skill can practice them without further explanation. Referring to structure 10 of FIG. 2B, and endpoint detector could be used to sense the end of etching insulating layer 18 or the start of etching of conductive layer 20. In a preferred embodiment where insulating layer 18 is formed from silicon nitride, we have found that a suitable endpoint for etching insulating layer 18 may be determined by monitoring a range of wavelengths centered about a wavelength of about 2700 angstroms.

The next step of the present invention, as set forth in block 108, is to unload the substrate.

Next, block 110 represents a decision point to determine whether to process another substrate according to the invention or cease processing operations. If additional substrates are to be processed, then the decision at block 110 is "yes". In this case, another substrate having an exposed layer is loaded into the processing reactor in accordance with block 102. If no additional substrates are to be processed, then the answer to decision block 110 is "no" and substrate processing ceases.

Examples of the Single Plasma Etch Step Method

The single step method of the present invention can be better appreciated through reference to the specific examples that follow. In each of the specific embodiments that follow, the inventive method achieves a silicon nitride etch rate of greater than two microns per minute. These specific embodiments are described as implemented in a computer-controlled plasma etch chamber 200 illustrated in FIG. 5A and 5B and described in greater detail below. It is to be appreciated that these specific examples are provided by way of illustration and not limitation.

In one specific embodiment, the gaseous mixture is formed from an etchant gas and a sputtering gas where about 85% of the total gas flow into the chamber is provided by the etchant gas. This gaseous mixture is formed into a plasma from a total power of at least about 2000 W of which about 90% is provided from the source power generator 218. The chamber is maintained at a pressure of about 20 mT during this embodiment of the inventive method. In an alternative embodiment of this specific embodiment, a plasma is formed from an etchant gas flow rate that is about six times the sputtering gas flow rate, with a source power level of about. 1800 Watts and a bias power level of about 200 Watts. In yet another alternative embodiment of this specific embodiment, the etchant gas is as $SF_6$ and the sputtering gas is Argon.

In another specific embodiment, the gas mixture is formed only from an etchant gas and a sputtering gas where about 85% of the total gas flow is provided by the etchant gas. This gas mixture is formed into a plasma by a total power provided into the chamber that is more than 2200 watts where at least about 91% of the total power is provided by the source power generator 218. In this specific embodiment, the chamber is maintained at about 40 mTorr. In an alternative embodiment of this specific embodiment, most of the power provided to the chamber is inductively coupled to the chamber. In yet another alternative embodiment of this specific embodiment, the etchant gas flow rate is at least five times the sputtering gas flow rate. In yet another alternative embodiment of this specific embodiment, the etchant gas is $SF_6$ and the sputtering gas is $N_2$ or is an inert gas selected from the following: Ar, Kr, Xe, and Ne.

In yet another alternative embodiment of the present invention, the gaseous mixture is formed from about 85% etchant gas and about 15% sputtering gas. The gaseous mixture is formed into a plasma from a total power of about 2700 Watts with the source power providing about 93% of the total power. The silicon nitride etch rate of this embodiment is between about 2.5 $\mu$ to about 3 $\mu$ per minute. In a specific embodiment of this alternative embodiment, the source power level is about 2500 W, the bias power level is between about 200 W to about 225 W, the etchant gas is $SF_6$ and the sputtering gas is Ar.

In each of the above described embodiments, it is to be appreciated that the etchant gas could be a compound containing multiple fluorine atoms. In one specific embodiment, the compound containing multiple fluorine atoms is $SF_6$. It is also to be appreciated that the sputtering gas could be any gas of suitable molecular size for ion bombardment. For example, the sputtering gas could be $N_2$ or an inert gas such as Ar, Kr, Xe, and Ne. In a specific example, the sputtering gas is argon. In a preferred embodiment of the present invention, the gaseous mixture is formed by utilizing $SF_6$ as the etchant gas and argon as the sputtering gas.

II. TWO PLASMA ETCH STEP METHOD

Applicants have found that while the single step method the present invention provides a high etch rate (i.e., an etch rate greater than about two microns per minute), some applications using the inventive high etch rate method would benefit from minimized over etching or damage of the underlying layers. The two plasma etch step of the present invention achieves high etch rate with minimal underlying layer damage by combining a high etch rate step with a low etch rate step. The high etch rate step is used to remove substantially all of the exposed layer while the low etch rate step removes the residual material from the layer to be etched without or with little damage to the underlying layers. This combination of high etch rate and low etch rate steps advantageously balances the competing interests of the high throughput and likely over etch achieved by the high etch rate process with the lower throughput but less likely to damage low etch rate process. By employing both a high etch rate process with a low etch rate process, applicants have been able to advantageously provide a high throughput process having a high degree of anisotropy with minimal likelihood of damage to adjacent layers.

In the two plasma etch step embodiment of the method of the present invention, the inventive etch process will be described with regard to a thick layer (i.e., a thickness of at least about five microns) of a difficult to etch material, such as, for example, silicon nitride. The high etch rate of the two-step method provides a commercially viable process for etching materials with a thickness of between about 15 to about 50 microns and up to over 100 microns. In the two plasma step embodiment of the method of the present invention, a first plasma etch step with highly aggressive chemical and sputter etch components is used to etch substantially. all of the material layer to be removed. Removing substantially all of the layer with this step insures a high throughput. Next, the lower etch rate or less aggressive chemical and sputter etch process is used to remove remaining portions of the layer not removed by the high etch rate step. Because the second or lower etch rate step is less aggressive than the first step (i.e. it has a lower and more easily controlled etch rate) it may be employed to etch away the remaining portion of the layer to be removed with little or no damage to the underlying layer or adjacent structures.

Figure 3:
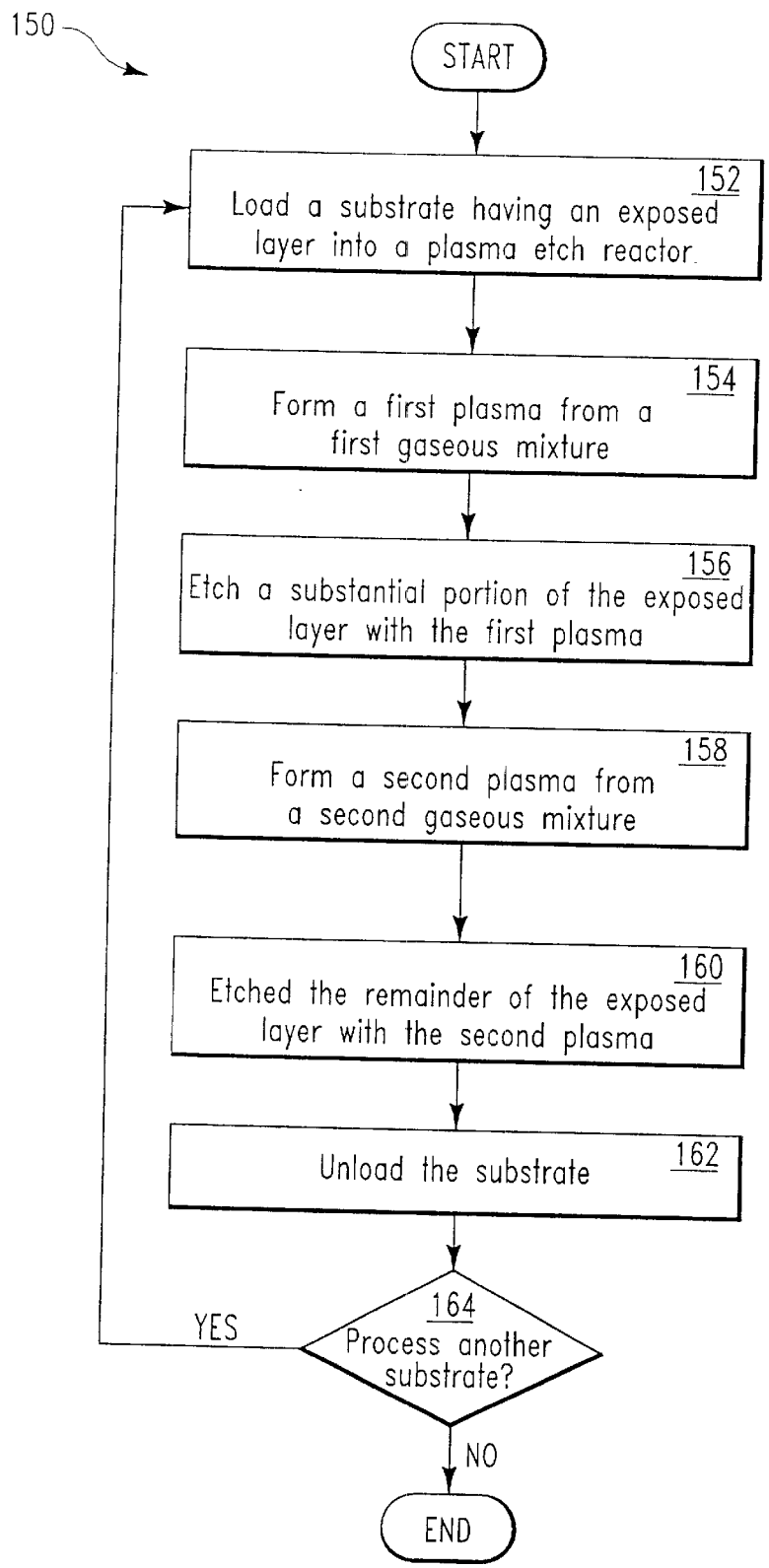
FIG. 3 is a flow chart of the two etch step method of the present invention.

Turning now to FIG. 3 and flowchart 150, the two plasma etch step embodiment of the method of the present invention can be better appreciated. The first step of the two plasma etch step method, as set forth in block 152, is load a substrate having an exposed layer into a plasma etch reactor. The two-step method of the present invention will be described as utilized to machine an exposed layer of a structure 40 illustrated in FIGS. 4A, 4B, 4C. Structure 40 is not drawn to scale and represents a material layer stack suitable for forming printhead cartridges for inkjet printers, for example. The general size and shape as structure 10, described above with regard to FIGS. 2A and 2B, is equally applicable to structure 40. It is to be appreciated that structures 10 and 40 are specific examples provided by way of illustration and not limitation. Embodiments of the methods of the present invention are applicable to a layer formed as part of a plurality of layers (as illustrated in structures 10 and 40) as well as to an application where only an isolated layer is to be machined.

Figure 4A:
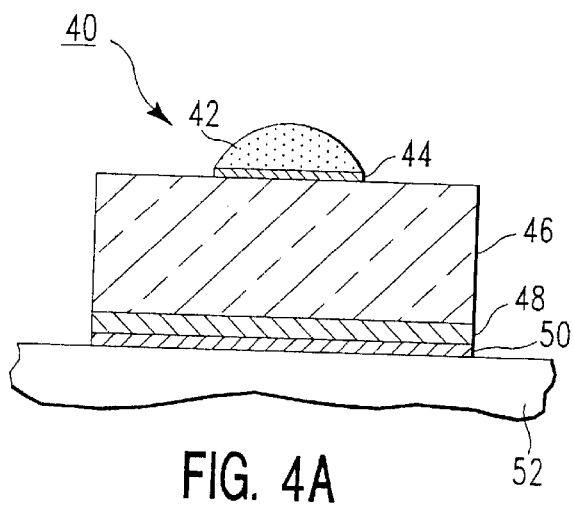
FIG. 4A is a schematic cross-section of a structure having a plurality of layers formed thereon and an exposed layer to be etched.
Figure 4B:
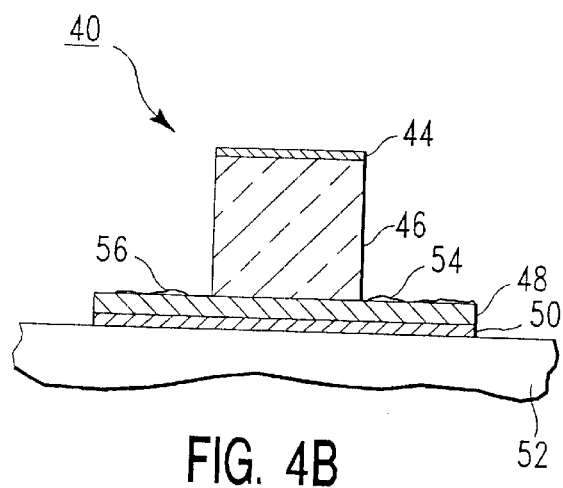
FIG. 4B is a schematic cross-section of the structure of FIG. 4A after performing the first etch step of the two etch step method of the present invention.
Figure 4C:
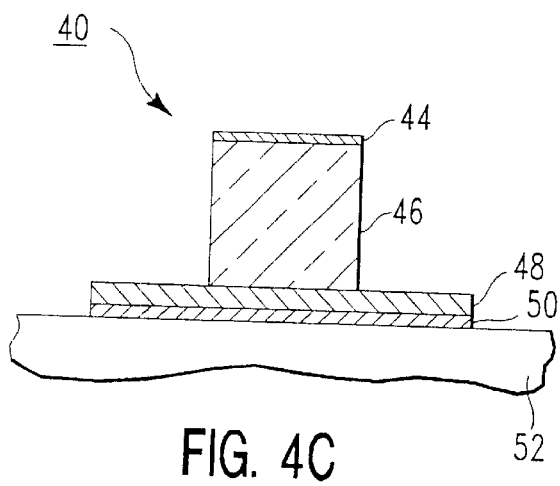
FIG. 4C is a schematic cross-section of the structure of FIG. 4B after performing the second etch step of the two-etch step method of the present invention.

FIG. 4A represents structure 40 before the two plasma etch step method has Keen performed, FIG. 4B represents structure 40 after the first plasma etch step of the two plasma etch step method has been performed and FIG. 4C represents structure 40 after the second plasma etch step of the two plasma etch step method has been performed. Structure 40 is a layer stack of similar composition to. structure 10 illustrated and described in relation to FIGS. 2A and 2B. Specifically, structure 40 is formed on a substrate 52. The first layer adjacent to the substrate is seed layer 50. On top of seed layer 50 is conductive layer 48. The next layer is insulating layer 46 which is followed by another conductive layer 44 and masking layer 42. As with structure 10, structure 40 is representative of a material layer arrangement suitable for the formation of ink jet printer heads.

Figure 5A:
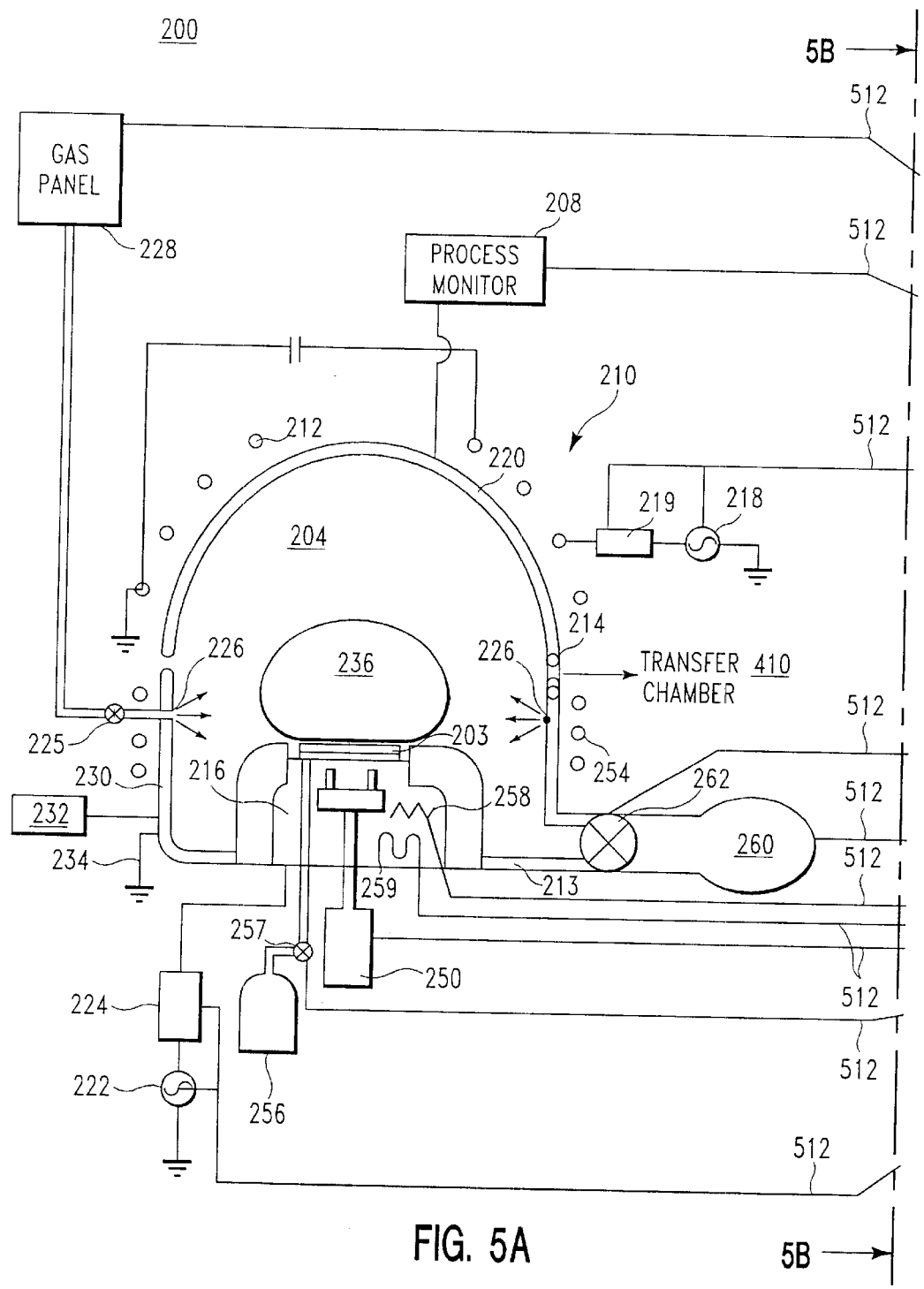
FIGS. 5A and 5B combined show a sectional schematic side view of a computer controlled high density plasma etching apparatus.
Figures 5, 5B:
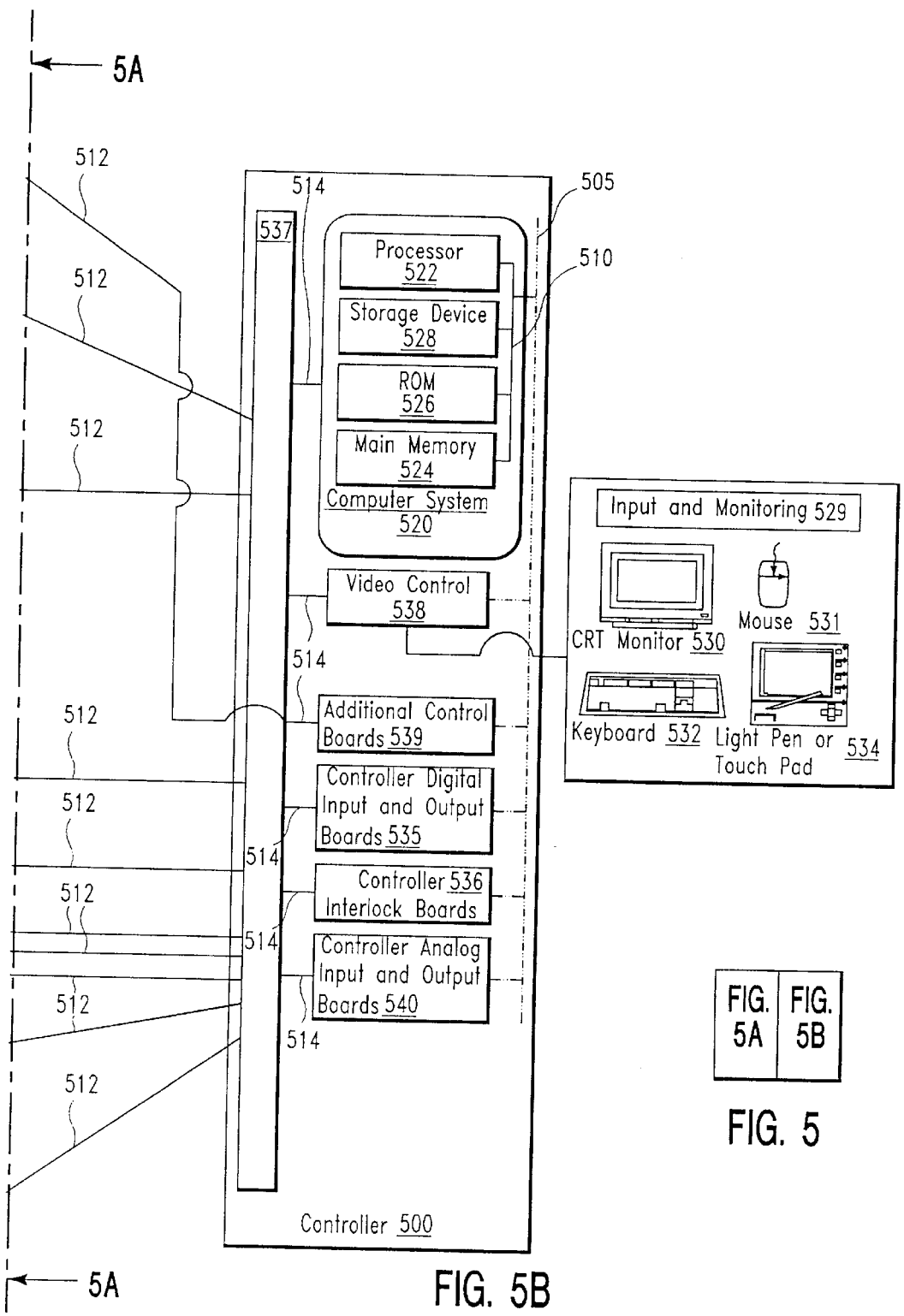

In an embodiment of the present invention the workpiece 203 loaded into the plasma reactor (as illustrated in FIG. 5A) could be a silicon substrate 52 having a structure 40 formed thereon. In that embodiment, insulating layer 46 is the exposed layer to be etched according to the present invention. In a preferred embodiment, the workpiece 203 has an exposed layer comprising silicon nitride. It is to be appreciated that the exposed layer is the layer to be removed according to the two plasma etch step method of the present invention.

FIG. 4A illustrates a typical layered structure for transferring masking layer 42 onto insulating layer 46. More specifically, structure 40 is formed on a silicon substrate 52. The first layer adjacent to the substrate is seed layer 50. Seed layer 50 could be formed from any material suitable for reducing the stress associated with depositing thick layers of silicon nitride. One material suitable for forming seed layer 50 is titanium nitride (TiN). For example, seed layer 50 could be approximately 0.9 microns thick. Conductive layer 48 is formed on top of seed layer 50. Conductive layer 48 could be formed from aluminum or other conductive materials with a thickness of about one to about four microns. Insulating layer 46 is formed on top of conductive layer 48. Insulating layer 46 could be formed from any suitable dielectric material such as silicon oxide or silicon nitride. In a preferred embodiment, insulating layer 46 is formed from silicon nitride and is between about 15 to 50 microns thick.

An additional conductive layer 44 is formed on top of insulating layer 46. Like conductive layer 48, conductive layer 44 could be formed from any of a number of conductive materials. In this embodiment of structure the 40, conductive layer 44 is formed from aluminum and is about 0.6 microns thick. Masking layer 42 is formed on top of the conductive layer 46 and is used to transfer the width of conductive layer 44 onto insulating layer 46. The thickness of masking layer 42 varies according to the thickness of layer to be etched (here, insulating layer 46) and the relative etch rates of masking layer 42 and the insulating layer 46. In an alternative embodiment of structure 40 (not shown) masking layer 42 is removed and the thickness of conductive layer 44 is increased such that conductive layer 44 acts as a masking layer in lieu of a photoresist masking layer 42.

The next step, according to block 154 of flowchart 150, is form a first plasma from a first gaseous mixture. The gaseous mixture in this step is formed by combining an etchant gas and a sputtering gas. The first step of the two plasma etch step method is the same as the etch step described above with regard to flowchart 100 at block 104.

The next step of the present invention, as set forth in block 156, is etch a substantial portion of the exposed layer with the first plasma. The duration of this step could be calculated by knowing the etch rate of insulating layer 46 and the thickness of insulating layer 46. Additionally, an endpoint detector may be utilized to monitor and detect the spectrum change in the plasma to determine when etching of insulating layer 46 ends or etching of conductive layer 48 begins. The use of endpoint detectors in etch processes is well-known in the art and those of ordinary skill can practice them without further explanation.

In a preferred embodiment, insulating layer 46 is formed from silicon nitride and endpoint is determined by monitoring a range of wavelengths centered about a wavelength of about 2700 Å. We have found that such a wavelength is associated with the end of silicon nitride etching and is a good indicator when to end the first plasma etch step of the two plasma etch step method. When this endpoint is detected, the first plasma etch step is promptly stopped. Stopping the high etch rate step upon endpoint detection ensures substantially all of the insulating layer 46 will have been removed using the high etch rate process thereby yielding high throughput. FIG. 4B represents structure 40 at the completion of step set forth in block 156 (i.e., the end of the first plasma etch step). Most, if not all, of masking layer 42 has been removed as has substantially all of insulating layer 46. Residual portions 54 and 56 of insulating layer 46 are illustrated on top of conductive layer 48.

Residual portions 54 and 56 are likely to be formed as a result of nonuniformities in the first plasma etch step process. Since different areas of the workpiece 203 (shown in FIG. 5A) etch more rapidly than others, some structures 40 will have been exposed to a lower etch rate and hence have mores residues 54 and 56. Additionally, variations in the thickness of insulating layer 46 across the substrate 52 will also occur. These variations in both etch rate and thickness result in endpoint detection while residual materials 54 and 56 remain on some structure 40. One advantage of the two-step method of the present invention is that the second lower etch rate step can be utilized to overcome these nonuniformities by removing the residues 54 and 56 without harming the underlying layer. Thus, rather than extending the first plasma etch step, or the high etch rate step, and risk damage to underlying layers, the high etch rate step is stopped and any residual material is removed by the less aggressive and lower etch rate process provided in the second plasma etch step.

Thus, the next step of the two etch step method of the present invention, as set forth in block 158, is form a second plasma from a second gaseous mixture. The second gaseous mixture and plasma is less aggressive than the first gaseous mixture and plasma. As such, the etchant gas flow rate in the second gaseous mixture is less than the etchant gas flow rate used in the first gaseous mixture. Second gaseous mixture etchant flow rates that are about 78% of the first gaseous mixture etchant flow rate provide the advantageous result of removing residual material without damage to other layers of structure 40. Additionally, advantageous results have been obtained when the first step etchant gas flow rate is about 1.5 times the second step etchant gas flow rate. The chemical etch component of the second plasma etch step is advantageously modified by adjusting the etchant gas flow rate, the sputter component of the second plasma etch step can similarly be adjusted by altering the sputtering gas flow rate in the second etch step. In one embodiment, reducing the sputtering gas flow rate in the second etch step to between about 60% to about 65% of the sputtering gas flow rate in the first step has provided advantageous results.

Additional specific gaseous mixture alterations that have provided the advantageous results of the two plasma etch step embodiment of the method of the present invention include: (1) reducing etchant gas flow rate from the first step to second step while sputtering gas flow remains constant; (2) reducing both the etchant gas and the sputtering gas flow rates by about 66% from the first etch step to the second etch step; and (3) reducing the etchant gas flow rate by about 78% from the first step to the second step while only reducing the sputtering gas flow rate by about 65% between the first step and the second step.

In addition to modifying the gaseous mixture, the energy used to form the second plasma. may also be adjusted to provide the advantages of the present invention. As described above with regard to the alternative second gaseous mixture embodiments, gaseous composition alone can be used to reduce the etch rate of the second plasma etch step. In one specific embodiment, source and bias power levels remain the same so that a constant level of total power is applied to the first plasma and second plasmas while the gaseous compositions used to form the first and second plasmas are advantageously changed to accomplish a second plasma etch step with a lower etch rate than the first plasma etch step.

In another embodiment of the two etch step method of the present invention, both source and bias power levels to may be reduced from the levels used to form the first plasma (block 154) to the levels used in the second plasma (block 158). In one specific embodiment, the source power level in the second step can be about 90% of the source power level in the first step and the bias power level in the second step can be about 15% of the bias power level in the first step. In another specific embodiment, the source and bias power levels decrease from the first step to the second step while the source power as a percentage of total power increases from the first step to the second step. In yet another specific embodiment, the source power decreases from the first step to the second step so that in the second step source power is about 90% of the first step power. In this specific embodiment, the source power as is a percentage of total power increases from about 91% in the first step to about 98% in the second step. In yet another specific embodiment, bias power provides about 9% of the total power in the first step and only about 2% of total power in second step.

In another alternative embodiment, source power level remains constant from the first step to the second step while bias power level decreases from the first step to the second step. In a specific embodiment of this alternative embodiment, bias power level may provide about 10% of the total power in the first step and only about 2% of the total power in the second step. In another specific embodiment of this alternative embodiment, the bias power level in the second step is about 15% of the bias power level in the first step.

The next step of the two plasma etch step method of the present invention, as set forth in block 160 of FIG. 3, is etch the remainder of the exposed layer with the second plasma. Referring to FIG. 4B, the second plasma is formed to remove residual portions 54 and 56 of insulating layer 46. As described above, the gaseous mixture and energy levels employed to form the second plasma are such that the residues 54 and 56 are removed with little damage, or over etching of the other structure layers, in structure 40, for example, conductive layers 48 and 44. After exposure to the second plasma, residual materials 54, and 56 are removed and structure 40 appears as illustrated in FIG. 4C. Thus, at the end of the second plasma etch step according to the method of the present invention, the pattern of masking layer 44 has been transferred onto insulting layer 46, the residual portions of insulating layer 46 are removed and conductive layers 44 and 48 have suffered little or no damage.

The duration of the second etch step can be determined in a number of ways. For example, an endpoint detector could be utilized to monitor the composition of the second plasma and register when material of conductive layer 48 is being etched thereby signifying that the residuals of insulating layer 46 are removed. However, this method may result in damage to conductive layer 48 since the layer must be etched to signal the end point. Another method to determine the duration of the second step is to have the second step last for a percentage of the total process time of the first etch step. In this manner, the duration of second step can be easily calculated using the duration of the first etch step (block 156). We have found that second plasma etch steps (block 160 of flow chart 150 of FIG. 3) lasting from between about 5% to about 40% of the duration of the first etch step (block 156 of flow chart 150 of FIG. 3) have been employed to achieve the advantages of the present invention. More specifically, second plasma etch steps lasting about 20% of the duration of the first etch step have also provided the advantageous results of the present invention.

The next step according to the method of the present invention, as set forth in block 162, is unload the substrate. After unloading the substrate, decision block 164 is used to determine whether another substrate is to be processed according to the present two step embodiment of present invention forth in flow chart 150. If another substrate is to be processed, then the answer at block 164 is "yes" and another substrate is loaded into the processing reactor in accordance with block 152. The substrate will then be processed according to the two etch step embodiment of the present invention. If no other substrates are to be processed, then the answer in decision block 164 is "no" and substrate processing according to the present method ends.

The steps of the two plasma etch step method as set forth above have been described serially for clarity. It is to be appreciated that the method of the present invention may be practiced where the steps are conducted nearly simultaneously. The invention may also be practiced where the first plasma is ignited and been-extinguished before the second plasma is is ignited. It is also to be appreciated that the first plasma may be sustained, formed into the second plasma nearly simultaneously without extinguishing the first plasma. These and other modifications of plasma formation are well-known in the art and are included in the method of the present invention.

Examples of the Two Plasma Etch Step Method

The two plasma etch step method of the present invention can be better appreciated through reference to the specific examples that follow. In each of the specific embodiments that follow, the inventive method achieves a silicon nitride etch rate of greater than two microns per minute in the first step and a silicon nitride etch rate of less than 2 $\mu$m (microns) per minute in the second step. These specific embodiments are described as implemented in a computer-controlled plasma etch chamber 200 illustrated in FIGS. 5A and 5B and described in greater detail below. It is to be appreciated that these specific examples are provided by way of illustration and not limitation.

In a first specific embodiment of the two plasma etch step method, the first and second gaseous mixtures are 86% etchant gas and 14% sputtering gas. The etchant gas flow rate in the second gaseous mixture is about 66% of the etchant gas flow rate in the first gaseous mixture. The sputtering gas flow rate in the second gaseous mixture is about 60% of the sputtering gas flow rate in the first gaseous mixture. The total power applied to the first plasma is greater than the total power applied to the second plasma. Source power level in the second step as a percentage of the total power applied to the second plasma is greater than the source power level in the first step as a percentage of total power applied to the first plasma. More specifically, the source power is about 90% of the total power applied to the first plasma and about 98% of the total power applied to the second plasma. Bias power level in the first step as a percentage of the total power applied to the first plasma is greater than the bias power level in the second step as a percentage of the total power applied to the second plasma. The bias power level applied to the first plasma is about 10% of the total power applied to the first plasma while bias power level applied to the second plasma is only about 2% of the total power applied to the second plasma.

In an example of the first specific embodiment, the first plasma may be formed in a process chamber 200 of FIG. 5A from a gaseous mixture where $SF_6$ is the etchant gas and Ar is the sputtering gas. More specifically, the first gaseous mixture is formed from 150 sccm $SF_6$ and 25 sccm Ar. The power levels for the first plasma are 1800 Watts source power and 200 Watts bias power at a pressure of about 20 mTorr (mT). After conducting the first plasma etch step for a period of time sufficient to remove the exposed layer, a second plasma is formed to remove the residual portions of the exposed layer not removed by the first plasma etch step. In this specific embodiment, the second step gaseous mixture is formed from 100 sccm $SF_6$ and 15 sccm argon. The pressure is reduced to 10 mT while the source power remains constant at 1800 Watts and the bias power is decreased to about 30 Watts. The second step is maintained for about 20% of the duration of the first step.

In a second specific embodiment of the two plasma etch step method of the present invention, the source and bias power levels, etchant gas percentages and sputtering gas percentages are all decreased so that the second step level or percentage is less than the first step level or percentage. For example, the first step could have a gaseous mixture of 127 sccm $SF_6$ and 23 sccm Ar formed into a plasma with 2000 Watts source power and 200 Watts bias power and maintained at a pressure of about 40 mT. In one embodiment of a specific second etch step, the etchant gas flow rate in the second plasma etch step is only about 78% of the etchant gas flow rate in the first plasma etch step. The sputtering gas flow rate in the second step is only about 65% of the sputtering gas flow rate in the first step. The etchant gas makes up about 87% of the total gas in the second gaseous mixture and the sputtering gas makes up only about 13% of the total gas in the second gaseous mixture. The chamber pressure in the second step is lower than the first step or, more specifically, the second pressure could be about 25% of the first pressure. The source power level in the second step is about 90% of the source power level of the first step. The bias power level in the second step is about 15% of the bias power level used in the first step. Source power provides about 98% of the total second step power while bias power provides only about 2% of the total second step power.

In an alternative embodiment of the second specific embodiment, the first gaseous mixture is formed from 127 sccm $SF_6$ and 23 sccm Ar at 40 mT. The first gaseous mixture is formed into a plasma, using 2000 Watts source power and 200 Watts bias power. The first plasma is sustained for a time sufficient to remove the exposed layer. The second gaseous mixture is formed from about 100 sccm $SF_6$ and 15 sccm Ar at a pressure of about 10 mT. The second gaseous mixture is formed into a plasma using about 1800 Watts source power and about 30 Watts bias power. The workpiece is exposed to second plasma for a period of time from between about 10% to about 40% the length of the first etch step.

In a third specific embodiment of the two plasma etch step method of the present invention, the total power level remains constant between the first step and the second step and the sputtering gas portion of the total gaseous mixture is greater in the second gaseous mixture than in the first gaseous mixture. The pressure is decreased from the first step to the second step such that second step pressure is about 50% of the first step pressure. The etchant gas is flow rate in the second step could be about 66% of the etchant gas flow rate in the first step. The first gaseous mixture includes about 86% etchant gas and about 14% sputtering gas while the second gaseous mixture includes only about 80% etchant gas and about 20% sputtering gas. The total gas flow of the second step can be about 70% of the total gas flow of the first step.

In an alternative embodiment of the third specific embodiment, the first gaseous mixture is formed from 150 sccm $SF_6$ and 25 sccm Ar at a pressure of about 20 mT. The first plasma is formed from the first gas mixture at 1800 Watts source power and 200 Watts bias power. The second gaseous mixture is then formed from 100 sccm $SF_6$ and 25 sccm Ar at a pressure of about 10 mT. The second plasma is formed from the second gaseous mixture exposed to 1800 Watts source power and 200 Watts of bias power. As before, the first step is maintained for a sufficient period of time to substantially remove the exposed layer and the second step is maintained for a period of time from between about 10% to about 40% of the first step.

While several alternative embodiments and numerous specific examples have been set forth, one of ordinary skill in the art of plasma etch processing will appreciate that the inventive methods are not limited to these particular embodiments. One of ordinary skill will also appreciate that while the method of this invention is especially useful for difficult to etch materials such as silicon nitride, the inventive method may be applied to etch other materials as well. It is to be appreciated that the high etch rate methods of the present invention would provide even higher etch rates when utilized to etch or machine other less difficult to etch materials.

The method of the present invention has been described with regard to etching one layer that is part of a plurality of layers. Structures 10 and 40 are provided to illustrate two of several different applications for the present inventive method. It is to be appreciated that the method of the present invention may be utilized on other structures as well. For example, the method of the present invention may be employed to a single bulk layer of material. The structure likely to be etched in this example could include a silicon nitride layer formed on a workpiece and a masking layer formed on top of the silicon nitride. Micro-machining arcuate surgical implements from silicon nitride blocks about 70 microns thick is one of the numerous examples of such structures. Inkjet printer heads, pressure sensors and accelerometers are also examples of structures that can be formed utilizing the methods of the present invention. Other applications for the microfabrication methods of the present invention will occur to those of ordinary skill in the art and are intended to be included herein.

III. Exemplary High Density Plasma Etch Chamber

FIG. 5A depicts a schematic diagram of a computer controlled semiconductor wafer high density plasma (HDP) etch processing system 200 in which embodiments of the methods of the present invention can be practiced. The depicted system is illustrative of an inductively coupled plasma etch system. A representative processing chamber of this type is a Silicon Etch DPS. chamber available from Applied Materials, Inc. of Santa Clara, California. A detailed description of the DPS chamber of the kind used by applicants was described by Yan Ye et al. at the Proceeding of the Eleventh International Symposium of Plasma Processing, May 7, 1996, and as published in the Electrochemical Society Proceedings Volume 96–12, pp. 222–223 (1996). The invention, however, is applicable to and may be practiced in any DPS inductively coupled plasma (ICP), or other plasma based processing system where separately controllable source and bias power levels are available. The particular embodiment of the process chamber 200 shown herein, which is suitable for processing workpieces 203, is provided only to illustrate the invention, and should not be used to limit the scope of the invention.

The schematic of the processing system in FIG. 5A shows an etching process chamber 210, that includes an inductive coil antenna 212 positioned exterior to a dielectric, dome-shaped ceiling 220 (referred to as dome 220). The antenna segment 212 is coupled to a radio frequency (RF) source 218 that is generally capable of producing an RF signal having a tunable frequency of about 12.56 MHz. RF source 218 is coupled to the antenna 212 through a matching network 219. Source 218 is also referred to as the source power generator. The process chamber 210 also includes a workpiece support pedestal (cathode) 216 which is connected to a second RF source 222 that is capable of producing a RF signal at a frequency of about 400 kHz. RF source 222 is coupled to workpiece support 216 through a matching network 224. RF source 22 is also referred to as the bias power generator.

The chamber 210 also contains a sidewall 230 and a bottom 213 formed from a conductive material such as aluminum or stainless. steel. Sidewall 230 is connected to electrical ground 234. Chamber 210 has an inner volume 204 defined by dome 220, wall 230 and a bottom 213. Referring to FIG. 5B, a computer system 520 including a processor 522, a storage device 518, read only memory (ROM) 526 and main memory 524 is coupled to the various components of plasma etch chamber 210 to facilitate control of the plasma etch process. Computer system 520 and controller 500 are described below in regard to FIGS. 7A and 7B.

Figure 6:
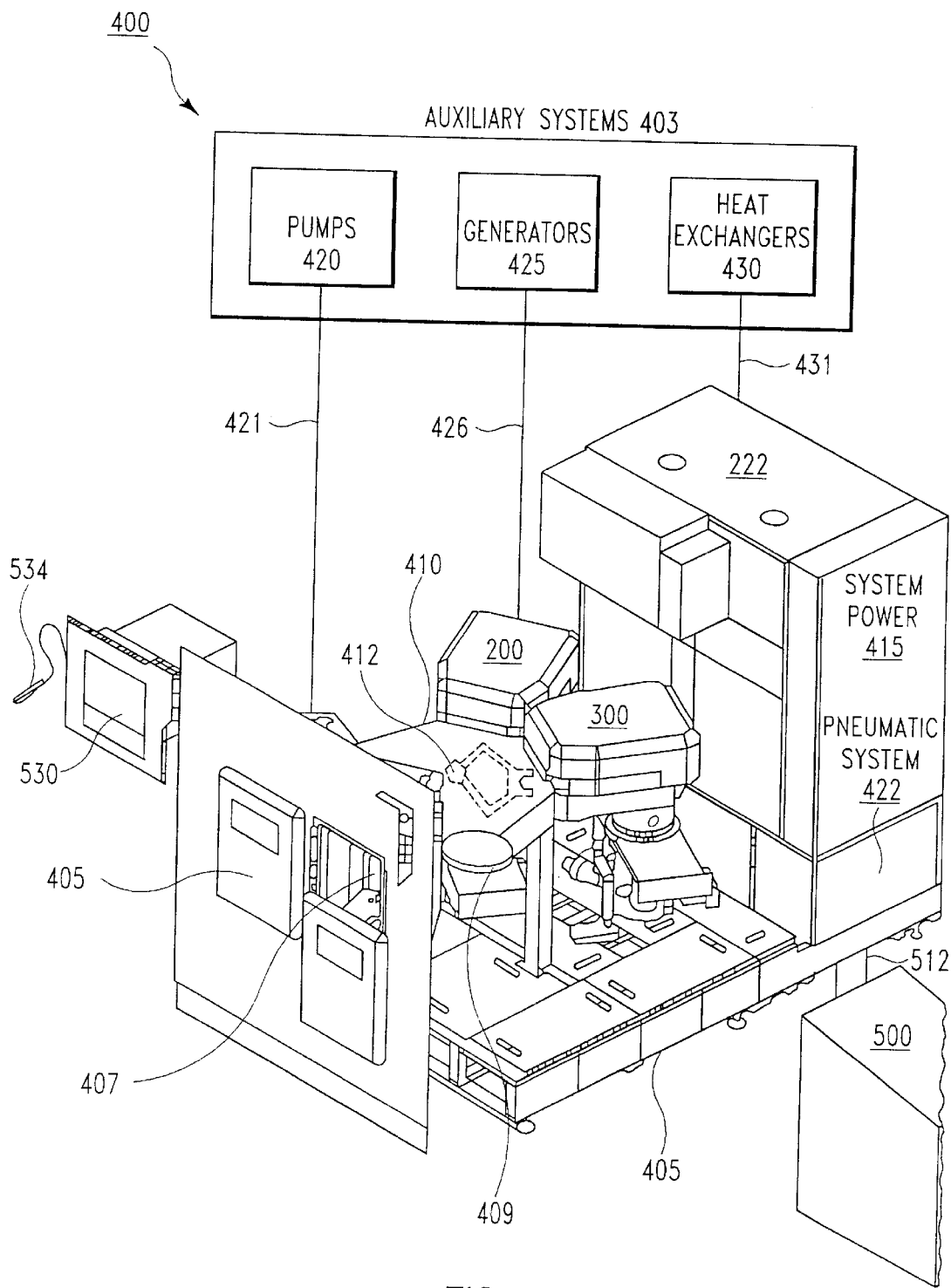
FIG. 6 is a partially schematic top view of a computer controlled semiconductor processing system.

In operation, a workpiece or semiconductor substrate 203 is placed on support pedestal 216 via a robot (not shown) from transfer chamber 410 (transfer chamber 410 is shown in FIG. 6). The substrate can be held in place during processing using mechanical clamping means or an electrostatic chuck. When open, slit valve 214 provides access into chamber volume 204 from transfer chamber 410. When closed, slit valve 214 provides a pressure seal between chamber 210 and transfer chamber 410. A robot (not shown) and a lift and positioning mechanism 250 transfer and place, respectively, a semiconductor substrate or other workpiece, which may contain partially formed integrated circuits or structures for micromachining, on support pedestal 216. Gaseous components from gas panel 228 are provided through gas control valve or valves 225 to gas inlets 226 to form a gaseous mixture within internal volume 204. For clarity, only a single line and valve are shown.

In a plasma etch process, the gaseous mixture is ignited into a plasma 236 by applying RF power from the RF sources 218 and 222 to the inductive antenna 212 and workpiece pedestal 216 respectively. Those skilled in the art will realize that a plurality of steps is necessary to excite a plasma in a process chamber, i.e., supply a process gas, apply source power to the antenna, apply bias power to the pedestal and so on. One of ordinary skill in the art can perform these steps without further explanation.

The processing environment within chamber 210 is controllable. The temperature of sidewall 230 is controlled by fluid circulated in conduits 254 in or around sidewall 230. If desired, lamps or other heat sources could be used to heat chamber 210. Likewise a fan (not shown) could be used to cool dome 220. Pressure within processing chamber 210 is controlled by actuating a throttle valve 262 positioned between chamber interior volume 204 and vacuum pump 260. Pressure control within chamber 210 is further facilitated by a manometer or other pressure sensing device in communication with volume 204. Additional chamber sensors 232 such as endpoint detectors, safety interlocks or manometers may also be installed to further monitor or control the process conditions within chamber 210.

The temperature of substrate or workpiece 24 is adjusted and stabilized by controlling the temperature of pedestal 216 with either heating element 258 or by circulating temperature controlled fluid through conduit 259. A- backside gas is provided from bulk gas supply 256 via valve and piping 257 to the interstitial spaces between substrate 203 and pedestal 216. The backside gas, typically an inert gas such as Helium, facilitates heat transfer between substrate 203 and pedestal 216.

A process monitor 208 monitors conditions within the process chamber 210. The process monitor can be any sensor, or combination of sensors, for measuring a condition that is dependent on the process occurring within the chamber 210. By way of example, the process monitor 208 is an Optical Emission Spectrometer (OES) or an endpoint detector. The OES monitors emission of radiation from the plasma 236. Such radiation is dependent on the progress of the process occurring in the process chamber 210. Alternatively, the process monitor 208 could include an interferometer for measuring elevations such as the depth of trenches etched into a surface of the wafer 203. Such an interferometer measures the depth of the trenches by interference of light reflected from the top and bottom of the trenches. If the process monitor 208 is an OES or interferometer, radiation from within the chamber 210 is coupled to the process monitor 208 through a transparent aperture. The top 220 can be used as the aperture if it is made of a transparent material such as quartz. Alternatively a separate window can be provided in the top 220 or sidewall 230 for this purpose.

As described below in more detail with regard to FIG. 5A, processing system 200 could be one of several chambers coupled to a common transfer chamber or loadlock as part of a cluster tool processing system. Access to the processing volume 204 is provided via slit valve 214 which separates chamber 200 from common transfer chamber 410. Wafer transfer robot 412, shown in phantom in FIG. 5A within transfer chamber 410, would operate cooperatively under the control of system controller 500 with lift and positioning mechanism 250 and slit valve 214 to place substrate 203 on pedestal 216.

Figure 7A:
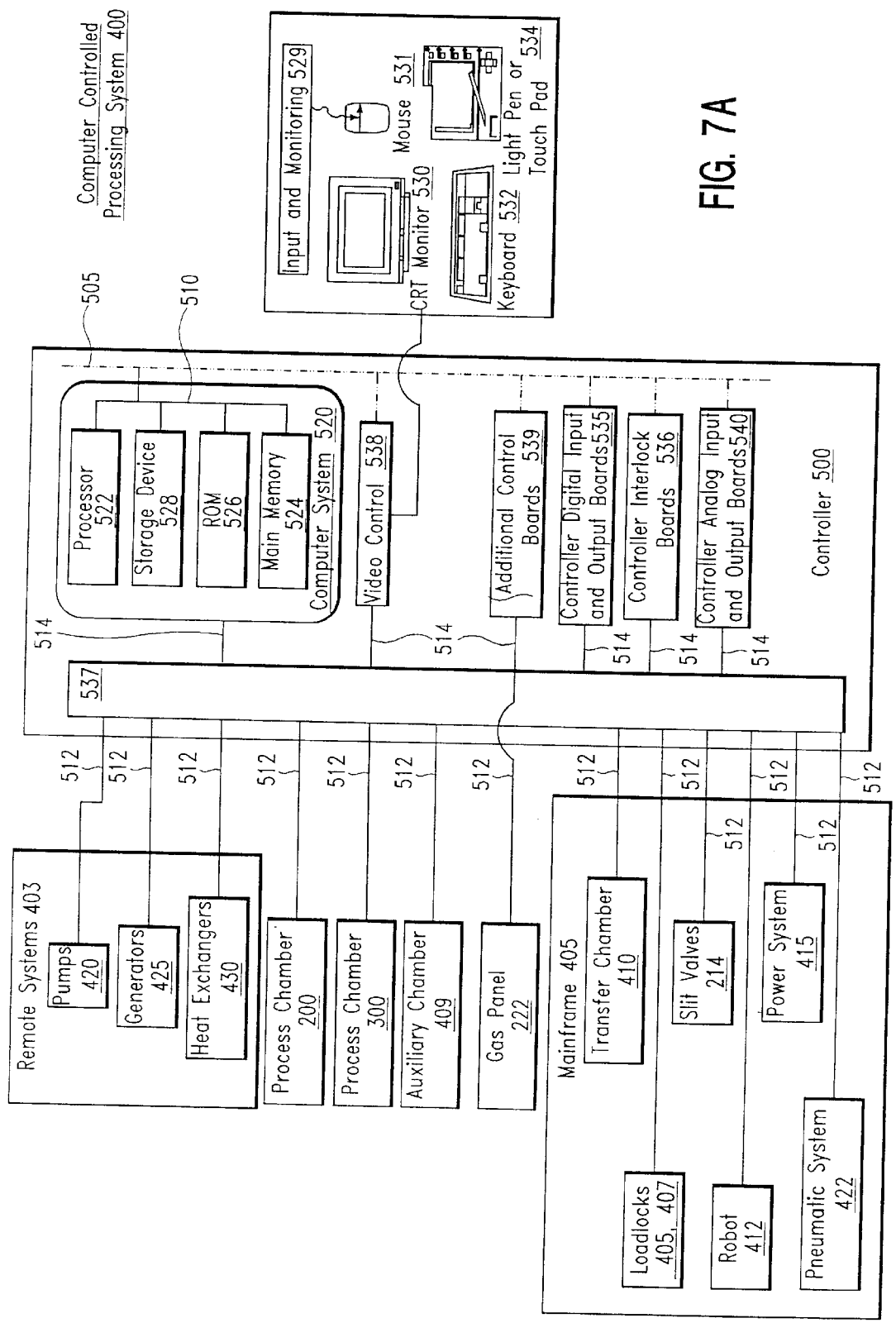
FIG. 7A is a schematic view of a computer system suitable for implementing a method of the present invention on a computer controlled processing system.
Figure 7B:
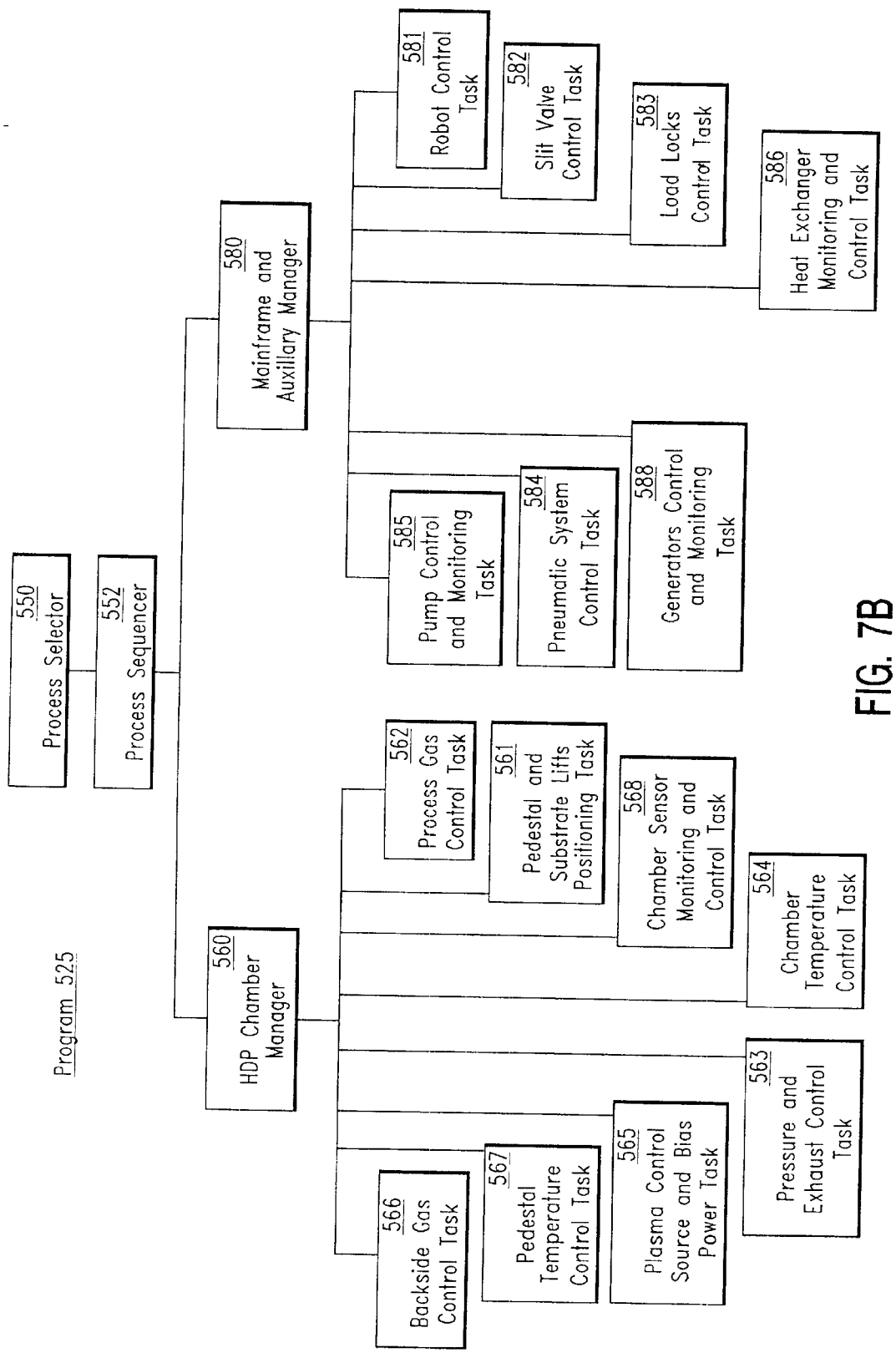
FIG. 7B is a schematic view of a computer program suitable for controlling a processing system to implement a method of the present invention.

As described in more detail with regard to controlling system 500 in FIGS. 7A and 7B, all the various monitoring and controlling components of chamber system 200 are controlled by computer system 520 in controller 500. All the various monitoring and controlling components of chamber system 200, are coupled via suitable signaling cable 512 to the controller 500 via backplane 537. As described in more detail in FIGS. 7A and 7B, computer system 520 communicates various signals to processing chamber 200 via controller analog, digital and interlock input and output boards 535, 536 and 540. Some components, such as gas panel 228 for example, may be connected directly to an additional control board 539. The controller 500 along with computer system 520 include hardware and software necessary to monitor the signals needed to initiate, monitor, regulate, and terminate the processes occurring in process chamber 210.

V. Exemplary Multi-Chamber Integrated Processing System

FIG. 6 illustrates a computer controlled, integrated, modular, multiple chamber, vacuum processing system 400 of the type described in U.S. Pat. No. 4,951,601 to Maydan et al. with a dual loadlock of the type described in U.S. Pat. No. 5,186,594 to Toshima et al. Computer controlled processing system 400 includes a mainframe 405, system controller 500 and auxiliary system 403. Mainframe 405 is the support structure for central transfer chamber 410, processing chambers 200, auxiliary chamber 409 and loadlocks 407 and 405. Mainframe 405 also supports gas panel 228, system power panel 415 and pneumatic supply system 422. Common transfer chamber 410 which includes a wafer exchange robot 412 (shown in phantom) adapted to move wafers between loadlocks 405 and 407 and the processing and auxiliary chambers 200, 300 and 409. Processing system 400, for example, could be a Centura™ processing system as is commercially available from Applied Materials, Inc. of Santa Clara, Calif.

Dual loadlocks 405 and 407 receive substrates for processing in processing system 400. Each loadlock operates independent of the other which means that while one loadlock is under vacuum and in communication with is central transfer chamber 410, the other loadlock may be open to atmosphere and receiving additional substrates for processing. Processing chambers 200, and auxiliary 409 chambers coupled to central transfer chamber 410 are suitable for sequentially and simultaneously performing different process steps such as deposition, etching, physical sputtering, rapid thermal anneal and chemical mechanical polishing of dielectric, semiconductor and conductor layers on workpieces such as, for example, semiconductor wafers. Processing system 400 can be configured with different processing chambers to perform a combination of different processing steps or with a number of similar processing chambers which each perform the same processing operation. FIG. 6 illustrates a processing system 400 having two HDP etch chambers 200 each of which is configured to conduct embodiments of the method of the present invention.

Gas panel 228 includes valves and flow controllers (not shown) which are coupled to loadlocks 405 and 407, central transfer chamber 410 and auxiliary 409 and process chambers 200. Typically an inert gas, such as nitrogen, is employed to purge loadlocks 405 and 407 and central transfer chamber 410. Process gases including inert gases are provided to auxiliary and processing chambers 409, 200 and 300. Gases are provided to the various chambers under the control of computer controller 500.

Auxiliary systems 403 includes such equipment as vacuum pumps 420, generators 425 and heat exchangers 430. Additional equipment, such as ozone generators and exhaust treatment systems for example, may also be provided depending upon the specific application of processing system 400.

Pumps 420 typically include pumps of varying capacity to facilitate controlled pressure environments within process, auxiliary and transfer chambers and loadlocks of processing system 400. For example, pump 260 of Figure SA is one of the pumps included as part of pumps 420. Pumps 420 operate under the control of system controller 500. Pumping connection 421 is illustrated as a single line for clarity and is intended to represent suitable piping, wiring, and pneumatic connections between pumps 420 and the various components of mainframe 405.

Heat Exchangers 430 provide temperature controlled fluids under the control of system controller 500 for heating and cooling various components such as process chamber walls and substrate lift pedestals. Heat exchanger connection 431 is illustrated as a single line for clarity and is intended to represent suitable wiring and piping to couple heat exchangers 430 to the various components of mainframe 405.

Generators 425 include the RF power sources and other types of power sources needed to perform processing operations in processing system 400. Generator connection 426 is illustrated as a single line for clarity and is intended to represent suitable wiring and other components to couple the energy generated by generators 425 to the appropriate component on mainframe 405.

Typically, processing system 400 operates in a strictly controlled, high purity environment within a wafer fabrication facility or fab. The area surrounding loadlocks 405 and 407 is usually the most strictly controlled since substrates may be exposed to the fab atmosphere while being loaded into loadlocks 405 and 407. Given the high cost of maintaining such a high purity environment, processing system 400 is typically positioned within the fab to minimize the amount of clean room space needed. For example, loadlocks 405 and 407 would be in communication with the environment having the highest purity while a wall or other partition would separate the remainder of mainframe 405 from the high purity environment. Additionally, auxiliary systems 403 may be located remote to mainframe 405 to further reduce the amount of clean room space occupied by processing system 400. FIG. 6 represents such a remote placement of auxiliary systems 403. It is to be appreciated that occasionally some auxiliary system components, such as generators 425 for example, may be positioned on mainframe 405 adjacent to their respective chambers.

System controller 500, described in more detail below with regard to FIG. 7A, monitors and directs all the functions of processing system 400. The controlling functions of system controller 500 include but are not limited to monitoring all process parameters and system activities, controlling digital and analog signals, directing wafer transfers, program process recipes, and wafer sequences, controlling video and system interfaces within processing and auxiliary chambers, mainframe and auxiliary systems. Controller 500 communicated with processing system components via appropriate signaling cables 512. Controller 500 can be modified to perform other controlling functions as additional or different processing or auxiliary chambers or metrology equipment are added to processing system 400.

In operation, a user loads a cassette of substrates into loadlocks 405 and 407. Using CRT 530 and light pen 534 or other input device, the user inputs a processing sequence into the memory of controller 500 or activates a processing sequence stored in the memory of controller 500. A processing sequence typically involves pumping at least one of the loadlocks 405 and 407 and the central transfer chamber 410 to reduced pressure. According to the processing sequence, the robot 412 within central transfer chamber 410 sequences substrates from the cassettes inside loadlocks 405 and 407 to processing chambers 200 or auxiliary chambers 409. Once inside a processing or auxiliary chamber, a process program or recipe is executed which initiates, controls and terminates substrate processing operations within the respective processing or auxiliary chamber. After processing is completed, the processed substrate may be transferred to the loadlock or to another chamber for additional processing. One advantage of central transfer chamber 410 and loadlocks 405, 407 is that substrates may be repeatedly processed in one chamber by sequencing between a loadlock and a chamber or sequenced between several chambers without exposure to the fab atmosphere.

Completed substrates are transferred back into the cassettes within loadlocks 405 and 407. The loadlock with the completed cassette is vented to atmosphere and the completed cassette removed. An additional cassette is then loaded and the sequence repeats until all desired substrate processing is complete.

VI. Exemplary Computer Based Control System

The method of the present invention can be implemented in a computer controlled processing system 400 controlled by a processor based controller 500 of FIG. 7A. FIG. 7A illustrates a block diagram of a system controller 500 including a programmable computer system 520, control boards 539, 535, 563, 540 and input and monitoring devices 529.

Controller 500 includes a programmable computer system 520 upon which an embodiment of the present invention may be input and implemented. Computer system 520 includes a processor 522 coupled with bus 510 or other suitable communication mechanism for communicating information between the components of computer system 520 for processing information. Computer system 520 further comprises a random access memory (RAM) or other dynamic storage device 524 (referred to as main memory), coupled to bus 510 for storing information and instructions to be executed by processor 522 such as program 525. Main memory 524 also may be used for storing temporary variables or other intermediate information during execution of instructions by processor 522. Computer system 520 also includes a read only memory (ROM) and/or other static storage device 526 coupled to bus 510 for storing static information and instructions for processor 522. A data storage device 528, such as a magnetic disk or optical disk, is coupled to bus 510 for storing information and instructions.

Computer system 520 may also be coupled via system bus 505 to input and monitoring devices 529 for communicating and receiving information from a user. Controller 500 may also include a dedicated video board, such as video control board 538, to communicate between input and monitoring devices 529 and computer system 520. A display device 530, such as a cathode ray tube (CRT), may be used for displaying information to a user. An alphanumeric input device 532, including alphanumeric and other keys, may be coupled to bus 510 for communicating information and command selections to processor 522.

Another interface between a user and processor 522 is via a CRT monitor equipped with lightpen 534. A light sensor in the tip of the lightpen detects light emitted by CRT display. To select a particular screen or function, the operator touches a designated area of the display screen and pushes the button on the pen. The touched area changes its highlighted color, or a new menu or screen is displayed, confirming communication between the lightpen and the display screen. Another type of user input device is cursor control 531, such as a mouse, a trackball, or cursor direction keys for communicating direction information and command selections to processor 522 and for controlling cursor movement on display 530. Of course, other devices, such as a keyboard, mouse, or other pointing or communication device, may be used instead of or in addition to lightpen to allow the user to communicate with processor 522. Mouse and pen based input devices as well as touch and light sensitive screens are well known in the art. Such a system may also lack a keyboard such as 532 wherein all interface is provided via the stylus as a writing instrument (like a pen) and the written text is interpreted using optical character recognition (OCR) techniques.

Controller 500 also includes control boards for sending, receiving and monitoring components of processing system 400. Controller digital input and output boards 535 are used to communicate digital signals between computer system 520 and the digitally controlled processing system components. Similarly, controller analog input and output boards 540 are used to communicate analog signals between computer system 520 and the analog controlled processing system components. Controller interlock boards 536 provide warning indications or cease operation of processing system 400 when hazardous or undesired conditions are detected. If desired, a single input and output board may be dedicated to a single component. Examples include the additional control board 539 that is dedicated to communicating with gas panel 228 and video control board 538 that is dedicated to communicating with input and monitoring devices 529.

The controller 500 components are attached to a back plane 537 via a suitable electronic connection 514 such as an edge connector, slot connector or ribbon cable. The computer monitored and controlled components of processing system 400 are connected to controller 500 using appropriate signal cables 512. Although represented as a single line for clarity, signal cable 512 could be a single cable or multiple cables. Signal cable 512 provides for digital, analog and interlock signaling between controller 500 and the components of processing system 400. Instead of connecting via back plane 537, system components may also be connected directly to a control board in controller 500. For example, gas panel 228 could be connected directly to additional control board 539. Such connections allow additional boards and signaling capability to be added as additional components are added.

Embodiments of the methods of the present invention can be implemented using a computer program 525 that is executed by processor 522. The computer program code can be written in any conventional computer readable programming language, such as 68000 assembly language, C, and Pascal. Of course a number of other suitable programming languages such as $C^{++}$, Java, or Jini could be used. Suitable program code is entered into a single file, or multiple files, using a conventional text editor, and are stored or embodied in a computer usable medium, such as main memory 524. If the entered code text is in a high level language, the code is compiled, and the resultant compiler code is then linked with an object code of precompiled library routines. A bootstrap loader is used to load the compiled object code into memory. Once loaded into memory the processor reads and executes the code to perform the task identified in the program.

The mass storage device 528 stores data and instructions and retrieves data and program code instructions from a processor-readable storage medium, such as a magnetic disk or magnetic tape. For example, the mass storage device 528 can be a hard disk drive, floppy disk drive, tape drive, or optical disk drive. The storage device 528 stores and retrieves the instructions in response to directions that it receives from the processor 522. Data and program code instructions that are stored and retrieved by the storage device 528 are employed by the processor unit 522 for operating the processing system 400. The data and program code instructions are first retrieved by the storage device 528 from a medium and then transferred to the memory 524 for use by the processor 522.

FIG. 7B illustrates schematically a representative computer program 525 that includes program code to monitor and control the processing chambers, mainframe and auxiliary system components of and the movement or sequencing of substrates through computer controlled processing system 400. In one method of controlling processing on system 400, program 525 includes instructions or recipes for sequencing and processing substrates in computer controlled system 400.

Processing recipes set forth the process task performed in the chambers to accomplish the desired substrate processes. Process tasks are conducted concurrently within recipe steps. The duration of a process recipe step is determined by one of several methods. A process step may be performed until, for example, a predetermined time period has elapsed; a process condition is satisfied such as a predetermined pressure is reached; or a sensor registers step terminating variable such as when an endpoint detector registers a particular wavelength emission. The process recipe, or program 525, includes predetermined sets of process parameters necessary to carry out specified processes, and are identified by predefined set numbers. The process selector 550 identifies (i) the desired process chamber, and (ii) the desired set of process parameters needed to operate the process chamber for performing the desired process.

The process parameters included in the recipe perform a specific process relate to process task such as, in a computer controlled HDP etch chamber 200 for example, controlling heating and cooling of pedestal 216 with pedestal temperature control task 567, gas panel composition and flow with process gas control task 562, pressure and exhaust control task 563, plasma control, source and bias power control task 565, and backside gas control task 566. The below descriptions of processing and sequencing recipes are provided merely for illustration. It is to be appreciated that numerous methods of programming the sequencing and processing of workpieces in a processing system may be implemented and that those methods will occur to those of ordinary skill in the art.

Sequencing recipes determine how substrates move from the loadlocks through the processing and auxiliary chambers of processing system 400. Sequencing recipes can be associated with individual substrates, groups of substrates or entire cassettes of substrates. Sequencing recipes employ scheduling algorithms to optimize substrate throughput, chamber utilization and minimize deadlocks. Program 525 also includes a process sequencer 552 that includes program code for accepting the identified process chamber and set of process parameters from the process selector 550, and for controlling operation of the various process chambers and mainframe components according to the process requirements. Multiple users can enter process set numbers and process chamber numbers, or a user can enter multiple process set numbers and process chamber numbers, so the sequencer 552 operates to schedule the selected processes in the desired sequence.

Preferably the sequencer 552 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, the sequencer 552 takes into consideration the present condition of the process chamber being used in comparison with the desired process conditions for a selected process, or the "age" of each particular user entered request, or any other relevant factor a system programmer desires to include for determining scheduling priorities.

Program 525 is invoked by a user in response to menus or screens displayed on the CRT monitor 530. A user enters a process recipe for a particular process chamber, loads a process recipe and sequence, or program 525. The parameters specified by the process recipe can also be entered utilizing the lightpen/CRT monitor interface, for example, or via downloading a recipe from a suitable computer storage medium such as a floppy disc.

Additionally, the process conditions within each chamber can be displayed on monitor 530 during processing operations.

Process selector 550 is used to indicate the desired process or processes to be conducted. Process recipes can be designated for each wafer individually or for an entire cassette of wafers. The selected process recipe provides the process selector with the desired process to be performed. Once the process sequencer 552 determines which process chamber and process set combination is going to be executed next, sequencer 552 causes execution of the process set or commands by passing the particular process set parameters or commands to a chamber manager 560 or mainframe manger 580 which control multiple tasks in process chambers 200 or mainframe and remote components according to the process set determined by the sequencer 552. For example, the HDP chamber manager 560 contains program code for controlling etch operations in a HDP etch chamber 200. The chamber manager 560 also controls execution of various chamber component tasks that in turn control chamber component operations necessary to carry out the selected process set.

Examples of HDP chamber component tasks are pedestal and substrate lifts positioning tasks 561, process gas control task 562, pressure and exhaust system control task 563, chamber temperature control task 564, and plasma, source and bias power control task 565, backside gas control task 566, pedestal temperature control task 567, and chamber sensor monitoring and control task 568. Those having ordinary skill in the art will readily recognize that additional other chamber control tasks can be included depending on the processes to be performed in the process chamber. In operation, the HDP chamber manager 560 selectively schedules or calls the process component task in accordance with the particular process set being executed. The HDP chamber manager 560 schedules the process component task similarly to how the sequencer 552 schedules which process chamber and process set are to be executed next. Typically, the chamber manager 560 includes steps of monitoring the various chamber components and sensors; determining which components need to be operated based on the process parameters for the process set to be executed; and causing execution of a chamber component task responsive to the monitoring and determining steps. Examples of mainframe and auxiliary manager 580 tasks are: robot position control task 581, slit valve position control task 582, load locks control task 583, pneumatic system control task 584, vacuum pumps control task 585, heat exchanger control task 586, and RF generator control and monitoring task 588. Typically the mainframe and auxiliary manager 580 includes steps of monitoring the various mainframe and auxiliary components and sensors, determining which components need to be operated based on the process parameters for the process set to be executed; and causing execution of a chamber component task responsive to the monitoring and determining steps.

The coordinated operation of particular control and monitoring tasks within a program 525 will now be described. In this example, a substrate 203 is to be transferred from loadlock 407 into chamber 210, processed and returned to loadlock 407. All process tasks and sequences contained within processing program 525 (illustrated in FIG. 7B) are described with reference to a HDP chamber 200 (illustrated in FIG. 5) on an integrated processing system 400 having a computer controller 500 (illustrated in FIG. 7A). The pedestal and substrate lift positioning task 561 includes program code for controlling pedestal and substrate lift chamber components 250 that are used to load the substrate onto the pedestal 216 and to lift the pedestal 216 to a desired processing position in the chamber 210. Loadlock control task 583, in cooperation with robot control task 581 and slit valve control task 582 facilitate the movement of a substrate 203 from a storage position, for example in loadlock 407, to a transport position on robot 412. Slit valve control task 582 executes commands to open slit valve 214 as robot control task 581 executes rotation and translation commands to robot 412 to load the substrate into the chamber. When a substrate 203 is loaded into the process volume 204, lift pins or other transfer mechanisms receive the substrate 203 from robot 412. After loading the substrate, the robot control task executes commands that withdraw robot 412 from the processing chamber after which slit valve control task executes commands to close slit valve 214. The lift pins or transfer mechanisms are then lowered to place the substrate 203 on the pedestal 216, and thereafter, the pedestal 216 is raised to the desired processing position in the chamber volume 204. In operation, the pedestal and lift positioning task 561 controls is movement of the pedestal and substrate lift mechanisms in response to process set parameters related to the pedestal position that are transferred from the HDP chamber manager 560.

The process gas control task 562 has program code for controlling process gas composition and flow rates for providing process gas from gas panel 228 into processing volume 204. The process gas control task 562 controls the open/close position of the shut-off valves 225, and provides control signals to mass flow controllers within gas panel 228 to obtain desired gas flow rates. The process gas control task 562 is invoked by the HDP chamber manager 560, as are all chamber component tasks, and receives from the chamber manager 560 process parameters related to the desired gas flow rates. Typically, the process gas control task 562 operates by opening the gas supply lines and repeatedly (i) reading the necessary mass flow controllers, (ii) comparing the readings to the desired flow rates received from the HDP chamber manager 560, and (iii) adjusting the flow rates of the gas supply lines as necessary. Furthermore, the process gas control task 562 includes steps for monitoring the gas flow rates for unsafe rates, and for activating the shut-off valves when an unsafe condition is detected. Alternatively, computer controlled mass flow control devices may also be incorporated so that the gas flow control task is performed by the flow control device with chamber manager 560 and controller 500 merely providing flow set points and monitoring gas flows for out of parameter conditions.

In some processes, an inert gas such as argon or nitrogen is flowed into the chamber volume 204 to stabilize the pressure in the chamber before reactive process gases are introduced into the chamber. For these processes, the process gas control task 562 is programmed to operate in coordination with pressure and exhaust control task 563 to provide steps for flowing the inert gas into the chamber volume 204 for an amount of time necessary to stabilize at the desired pressure in the chamber, and then the steps described above would be carried out. As discussed above, the desired process gas flow rates are transferred to the process gas control task 562 as process parameters. Furthermore, the process gas control task 562 includes steps for obtaining the necessary delivery gas flow rate by accessing a stored table containing the necessary values for a given process gas flow rate. Once the necessary values are obtained, the delivery gas flow rates are monitored, compared to the necessary values and adjusted accordingly.

In some chambers were a gas is introduced between the substrate 203 and the pedestal 216, as in HDP chamber 210, chamber manager 560 could include a backside gas control task 566. Backside gas control task 566 could include program code for controlling the pressure of gas provided between substrate 203 and pedestal 216 by controlling valve and flow controllers associated with backside gas supply 256. As with process gas control task 562 above, the backside gas control task 566 operates by opening the backside gas supply lines and repeatedly (i) reading the necessary mass flow controller, (ii) comparing the reading to the desired flow rate received from the HDP chamber manager 560, and (iii) adjusting the flow rate of the backside gas supply line as necessary. Furthermore, the backside gas control task 566 includes steps for monitoring the gas flow rate for unsafe rates, and for activating shut-off valves when an unsafe condition is detected. Additionally, computerized mass flow control devices could perform the backside gas control task with input and monitoring from chamber manager 560 and controller 500.

The pressure and exhaust control task 563 includes program code for controlling the pressure in the chamber volume 204 by regulating the size of the opening of the throttle valve 262 in chamber exhaust system 260 and the speed of pumps 420. The size of the opening of the throttle valve 262 is set to control the chamber pressure to the desired level in relation to the total process gas flow, size of the process chamber, and pumping setpoint pressure for the exhaust system 260. When the pressure and exhaust control task 563 is invoked, the desired, or target, pressure level is received as a parameter from the HDP chamber manager 560. The pressure and exhaust control task 563 operates to measure the pressure in the chamber volume 204 by reading one or more conventional pressure manometers connected to the chamber, compare the measured value to the target pressure, obtain PID (proportional, integral, and differential) values from a stored pressure table corresponding to the target pressure, and adjust the throttle valve 262 according to the PID values obtained from the pressure table. Alternatively, the pressure and exhaust control task 563 can be written to open or close the throttle valve 562 to a particular opening size to regulate the chamber volume 204 to the desired pressure.

The pedestal temperature control task 567 includes program code for controlling the current to heating element 258 or flow of temperature controlled fluid to conduits 259 that are used to control the temperature of pedestal 216 and substrate 203. The pedestal temperature control task 567 is also invoked by the chamber manager 560 and receives a target, or setpoint, temperature parameter. Pedestal temperature control task 567 operates cooperatively with heat exchangers control task 586 to ensure temperature controlled fluids are available and provided at a suitable temperature to obtain the set-point pedestal temperature. The pedestal temperature control task 567 measures the pedestal temperature by measuring voltage output of a thermocouple located in pedestal 216, compares the measured temperature to the setpoint temperature, and increases or decreases current applied to the heating element 258 or temperature controlled fluid to conduits 259 to obtain the setpoint temperature. The temperature is obtained from the measured thermocouple voltage, for example, by looking up the corresponding temperature in a stored conversion table, or by calculating the temperature using an appropriate mathematical calculation. Additionally, a built-in fail-safe mode can be included to detect process safety compliance, and can shut down operation of the heating and cooling elements if the process chamber 210 is not properly set up.

Chamber temperature control task 564 includes program code for controlling the flow of temperature controlled fluid from heat exchangers 430 to conduits 254 to control the temperature of chamber 210. The chamber temperature control task 564 is also invoked by the chamber manager task 560 and receives target set-point information according to user input, recipe instruction or maintenance instructions. The various temperature measurements described above with regard to pedestal temperature control task 567 can be implemented to measure and control the temperature of chamber walls 230. Chamber temperature control task 564 also operates cooperatively with heat exchangers control task 586 in order to provide temperature controlled fluids at the appropriate temperature to obtain the chamber temperature setpoint. As with pedestal temperature control task above, a fail safe mode may also be included to prevent chamber component damage should temperature control exceed safe limit values.

The plasma control task 565 comprises program code that operates in cooperation with generator control task 588 for setting source 218 and bias 222 RF power levels applied to inductive coil 212 and pedestal 216. Similar to the previously described chamber component task, the plasma control task 565 is invoked by the HDP chamber manager 560 and receives source and bias power set-points required by the processing operation being conducted in chamber 210.

The plasma control task 565 monitors RF power and impedance match settings and adjusts them accordingly to provide the requested source and bias power levels. Plasma control task 565 operates cooperatively with process gas control task 562 to ensure process gases are provided to chamber volume 204 for initiating and sustaining plasma 236.

Mainframe and Auxiliary Systems Manager 580, like HDP Chamber Manager 560, includes program code for controlling and monitoring the various components of mainframe 405 and auxiliary systems 403 of FIG. 6.

Mainframe and Auxiliary manager 580 includes program code for controlling the various components of mainframe 405 and auxiliary components 403. Mainframe and Auxiliary control manager is invoked by process sequencer 552 as is chamber manager 560. Mainframe and Auxiliary managers would include program code tailored to the specific components and parameters to be controlled. For example, robot control task 481 includes computer code for monitoring the position of robot 412 and generating rotation and extension commands based on the wafer sequencing requirements generated by process sequencer 552. Component specific monitoring and control program commands are included in slit valve control task 582. This task monitors the position of and communicates control signals for opening and closing chamber accessing valves, such as slit valve 214, that is used to separate processing chambers 200 from central transfer chamber 410. Slit valve control task 582 could also include safety control commands. These commands would, for example, prevent slit valve 214 from opening unless certain chamber pressure conditions existed in chamber 200 and transfer chamber 410 such as, for example, when both are under a prescribed pressure or when chamber 200 is at a higher pressure than transfer chamber 410.

Other monitoring and controlling task included in Mainframe and Auxiliary Control Manger task 580 are:pneumatic system control task 584, load locks monitoring and control task 583, heat exchanger monitoring and control task 586, loadlock and chamber vacuum pumps monitoring and control task 585, and RF generators monitoring and control task 588. Each of these task includes program code to monitor and control the specified component.

The above description of system controller 500, computer system 520 and monitoring and control program 525 are provided mainly for illustrative purposes. One of ordinary skill in the art will appreciate that other well known of similar controller architectures, computers, and programming codes and methodologies may be employed to monitor and control a multi-chambered integrated semiconductor fabrication system. Additionally, variations in the above described system controller such as a dedicated process control bus and redistribution of monitoring and controlling functions between mangers and task are possible.

Although the invention is described herein as being implemented in software and executed upon a general purpose computer, those skilled in the art will realize that it would be a matter of routine skill to select an appropriate computer system to control processing system 400. Those of skill in the art will also realize that the invention could be implemented using hardware such as a application specific integrated circuit (ASIC) or other hardware circuitry. Additionally, the chamber of FIG. 5A along with the chamber and mainframe controls illustrated in FIGS. 7A and 7B are merely illustrative of the types of chambers and types of chamber and mainframe controls employed. One of ordinary skill in the art will appreciate that additional controls could be added, while those illustrated could be combined or deleted if certain monitoring and control functions were not desired or provided elsewhere, without departing from the spirit of the present invention. As such, it should be understood that the invention can be implemented, in whole or in part, in software, hardware or both.

One of ordinary skill will appreciate that the method of the present invention may be embodied in a computer readable program code. This program code may be used by a computer controller, such as controller 500, for controlling a processing system, such as processing system 400 having at least one HDP processing chamber. According to the method of the present invention, a layer of material formed on a workpiece may be removed using the single step high etch rate method of the present invention. Alternatively, a layer formed on a substrate may be removed using the two plasma etch step method of the present invention. In the single step high etch rate method of the present invention, the program code controls the processing system to plasma etch a layer of material formed on a workpiece in accordance with the following steps: forming a plasma from a mixture of an inert gas and an etchant gas; and etching the exposed layer at an etch rate of at least 2 microns per minute.

Alternatively, in the two plasma etch step method of the present invention, the program code controls the processing system to plasma etch a layer of material on a workpiece in accordance with the following steps: forming a first plasma from a first gaseous mixture; etching a substantial portion of the exposed layer with the first plasma; forming a second plasma from a second gaseous mixture; and etching the remainder of the exposed layer with the second plasma.

Using the method of the present invention, processing throughputs can be increased by either the single plasma etch step or the two plasma etch step embodiments of the method of the present invention. The present invention has been described with reference to certain plasma etch processes, layers and processing chambers. However, other etchant gas and inert gas combinations, power levels and power ratios are possible.

is The method of the present invention has been described with regard to certain specific power levels from generators operating at specific frequencies such as the source power generator operating at about 12.56 MHz and bia power generator operating at about 400 kHz. It is to be appreciated that the present invention is not limited to these frequencies and power levels. One of ordinary skill in the art of plasma processing will appreciate that generators operating at other frequencies may be employed and the method of the present invention may be practiced by adjusting power levels to the frequency of the generators used. For example, if the frequency of the bias generator 222 is increased from the present frequency of about 400 kHz to a frequency of about 13.56 MHz, the bias generator power level at the higher frequency would need to be about three times the bias generator power level at the lower frequency to provide about the same amount of bias power to the plasma 236.

The inventive process described above is also applicable to other types of etch chambers capable of performing the method as would be apparent to one of ordinary skill. For example, the process can be practiced, as,would be apparent to one of ordinary skill in the art, in other chamber types which have two separately controllable power sources coupled to a plasma.

Having fully described several embodiments of the present invention, many other alternative or equivalent plasma etch methods according to the present invention will be apparent to those of ordinary skill in the art. These equivalents and alternatives are intended to be included in the scope of the present invention. Therefore, the spirit and scope of the appended claims should not be limited to the descriptions and embodiments contained herein.

We claim:

1. A method of plasma etching a silicon nitride layer which is about five microns thick or more prior to etching, the method comprising:
   (a) forming a plasma from a gaseous mixture, which plasma consists essentially of a fluorine-containing chemical etchant component and an ion bombardment component which produces sputtering of a surface being etched; and
   (b) etching said silicon nitride layer at an etch rate of greater than 2 microns per minute.

2. A method according to claim 1 wherein said silicon nitride layer has a thickness between about 10 microns to about 50 microns before etching.

3. A method according to claim 1 wherein said plasma is formed by exposing said gaseous mixture to energy provided by separately controllable power sources.

4. The method according to claim 3 wherein at least one of said power sources is inductively coupled to said plasma.

5. A method according to claim 1 wherein said etchant gas comprises a multiple-fluorine-atom containing compound.

6. A method according to claim 5 wherein said etchant gas comprises $SF_6$.

7. A method according to claim 1 wherein said sputtering gas is an inert gas.

8. A method according to claim 7 wherein said inert gas is selected from the group consisting of: Ar, He, Kr, Xe and Ne.

9. A method for plasma etching a silicon nitride layer which is about five microns thick or more prior to etching comprising:
   (a) forming a first plasma from a first gaseous mixture, which plasma consists essentially of a fluorine-containing etchant component and an ion bombardment component which produces sputtering of a surface being etched;
   (b) etching a first portion of said silicon nitride layer with said first plasma at a first etch rate greater than about 2 microns per minute;
   (c) forming a second plasma from a second gaseous mixture, which plasma consists essentially of a fluorine-containing etchant component and an ion bombardment component which produces sputtering of a surface being etched, wherein a flow rate of said etchant component, or a flow rate of said ion bombardment component, or a flow rate of both is reduced from a flow rate of said component in step (a); and
   (d) etching a second portion of said silicon nitride layer with said second plasma at an etch rate which is less than said first etch rate.

10. The method of claim 9, wherein said first gaseous mixture consists essentially of a fluorine-containing compound and an inert gas.

11. The method of claim 10, wherein said second gaseous mixture consists essentially of a fluorine-containing compound and an inert gas.

12. The method of claim 9, wherein said second gaseous mixture consists essentially of a fluorine-containing compound and an inert gas.

13. The method of claim 10 or claim 11 or claim 12, wherein said fluorine-containing compound is $SF_6$ and said inert gas is selected from the group consisting of: Ar, He, Kr, Xe and Ne.

14. The method of claim 10 or claim 11 or claim 12, wherein a flow rate of said etchant gas in said first gaseous mixture is greater than a flow rate of said etchant gas in said second gaseous mixture.

15. The method of claim 14, wherein said flow rate of said etchant gas in said second gaseous mixture is within a range of about 66 percent to about 78 percent of said flow rate of said etchant gas in said first gaseous mixture.

16. The method of claim 14, wherein a flow rate of said sputtering gas in said second gaseous mixture is less than a flow rate of said sputtering gas in said first gaseous mixture.

17. The method of claim 16, wherein said flow rate of said sputtering gas in said second gaseous mixture is within a range of about 60 percent to about 65 percent of said flow rate of said sputtering gas in said first gaseous mixture.

18. The method of claim 9, wherein a flow rate of said etchant gas in said first gaseous mixture is greater than a flow rate of said etchant gas in said second gaseous mixture.

19. The method of claim 9 or claim 18, wherein a flow rate of said sputtering gas in said second gaseous mixture is less than a flow rate of said sputtering gas in said first gaseous mixture.

20. The method of claim 9, wherein etching of said second portion is conducted at a second pressure which is lower than a first pressure used for etching said first portion.

21. The method of claim 20, wherein said second pressure is within a range of about 25 percent to about 50 percent of said first pressure.

22. The method of claim 9, wherein said first portion includes substantially all of said silicon nitride layer.

23. The method of claim 9, wherein said first portion is greater than said second portion.

24. The method of claim 9, wherein said first plasma is formed using a first energy provided from a first power source at a first power level and a second energy provided from a second power source at a second power level, and wherein said second plasma is formed using a third energy provided from said first power source at a third power level and a fourth energy provided from said second power source at a fourth power level.

25. The method of claim 24, wherein the total power provided at said first power level in combination with said second power level is greater than the total power provided at said third power level in combination with said fourth power level.

26. The method of claim 24, wherein the total power provided by said first power level in combination with said second power level is approximately equal to the total power provided at said third power level in combination with said fourth power level.

27. The method of claim 24, wherein said first power level is the same as said third power level, and said fourth power level is less than said second power level.

28. The method of claim 24, wherein a first power source is inductively coupled to said first plasma and said second plasma.

29. The method of claim 24, wherein said third power level provides a greater percentage of the total power provided by a combination of said third and said fourth power levels than said first power level provides as a percentage of the total power provided by said first power level in combination with said second power level.

* * * * *